(12) United States Patent
Lee et al.

(10) Patent No.: US 11,557,656 B2
(45) Date of Patent: Jan. 17, 2023

(54) SEMICONDUCTOR DEVICE HAVING A CAPPING PATTERN ON A GATE ELECTRODE

(71) Applicant: Samsung Electronics Co., Ltd., Seoul (KR)

(72) Inventors: Jonghan Lee, Namyangju-si (KR); Wandon Kim, Seongnam-si (KR); Jaeyeol Song, Seoul (KR); Jeonghyuk Yim, Seoul (KR); HyungSuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/024,813

(22) Filed: Sep. 18, 2020

(65) Prior Publication Data
US 2021/0005729 A1 Jan. 7, 2021

Related U.S. Application Data

(63) Continuation of application No. 15/990,983, filed on May 29, 2018, now Pat. No. 10,811,505.

(30) Foreign Application Priority Data

Nov. 29, 2017 (KR) .......................... 10-2017-0161937

(51) Int. Cl.
*H01L 29/423* (2006.01)
*H01L 27/088* (2006.01)
(Continued)

(52) U.S. Cl.
CPC .. *H01L 29/42364* (2013.01); *H01L 21/28247* (2013.01); *H01L 21/76834* (2013.01);
(Continued)

(58) Field of Classification Search
CPC ......... H01L 21/28247; H01L 21/76829; H01L 21/76832; H01L 21/76834; H01L 21/02362; H01L 29/511–513; H01L 29/518; H01L 29/42356–42364; H01L 21/823437; H01L 21/823456;
(Continued)

(56) References Cited

U.S. PATENT DOCUMENTS

| 8,426,300 B2 | 4/2013 | Ramachandran et al. |
| 9,034,703 B2 | 5/2015 | Cheng et al. |

(Continued)

FOREIGN PATENT DOCUMENTS

KR 20160011290 A 2/2016

*Primary Examiner* — Younes Boulghassoul
(74) *Attorney, Agent, or Firm* — Muir Patent Law, PLLC

(57) ABSTRACT

Disclosed are semiconductor devices and methods of manufacturing the same. The semiconductor device comprises a gate electrode on a substrate, an upper capping pattern on the gate electrode, and a lower capping pattern between the gate electrode and the upper capping pattern. The lower capping pattern comprises a first portion between the gate electrode and the upper capping pattern, and a plurality of second portions extending from the first portion onto corresponding side surfaces of the upper capping pattern. The upper capping pattern covers a topmost surface of each of the second portions.

19 Claims, 20 Drawing Sheets

(51) Int. Cl.
*H01L 29/51* (2006.01)
*H01L 29/66* (2006.01)
*H01L 21/28* (2006.01)
*H01L 21/8234* (2006.01)
*H01L 21/768* (2006.01)

(52) U.S. Cl.
CPC ......... *H01L 21/76897* (2013.01); *H01L 21/823437* (2013.01); *H01L 21/823475* (2013.01); *H01L 27/088* (2013.01); *H01L 29/518* (2013.01); *H01L 29/66545* (2013.01)

(58) Field of Classification Search
CPC ....... H01L 21/823828; H01L 21/82385; H01L 29/42376; H01L 21/823468; H01L 21/823864; H01L 29/6653; H01L 29/66553; H01L 29/6656; H01L 29/66545; H01L 21/28114; H01L 29/42384; H01L 29/7856
See application file for complete search history.

(56) References Cited

U.S. PATENT DOCUMENTS

| | | | |
|---|---|---|---|
| 9,064,801 B1* | 6/2015 | Horak | ............... H01L 29/66545 |
| 9,601,387 B2 | 3/2017 | Cai et al. | |
| 9,627,258 B1 | 4/2017 | Huang et al. | |
| 9,627,509 B2 | 4/2017 | Koo et al. | |
| 9,853,117 B2 | 12/2017 | Cho et al. | |
| 9,859,165 B1 | 1/2018 | Wu et al. | |
| 10,002,933 B1 | 6/2018 | Tang et al. | |
| 10,211,103 B1* | 2/2019 | Huang | ............... H01L 21/28247 |
| 2005/0199963 A1 | 9/2005 | Aoyama | |
| 2012/0064687 A1 | 3/2012 | Kondo et al. | |
| 2014/0197468 A1* | 7/2014 | Xie | ............... H01L 29/6656 257/288 |
| 2015/0123175 A1* | 5/2015 | Lin | ............... H01L 21/0334 257/288 |
| 2015/0206844 A1 | 7/2015 | Pham et al. | |
| 2015/0340491 A1 | 11/2015 | Zang et al. | |
| 2015/0364326 A1* | 12/2015 | Xie | ............... H01L 29/78 257/288 |
| 2016/0020294 A1 | 1/2016 | Koo et al. | |
| 2016/0043186 A1 | 2/2016 | Liu et al. | |
| 2016/0056262 A1 | 2/2016 | Ho et al. | |
| 2016/0240624 A1* | 8/2016 | Zhu | ............... H01L 21/28114 |
| 2016/0307758 A1 | 10/2016 | Li et al. | |
| 2016/0343827 A1 | 11/2016 | Wu et al. | |
| 2016/0365449 A1* | 12/2016 | Chang | ............... H01L 21/28247 |
| 2017/0103916 A1 | 4/2017 | Jeon et al. | |
| 2017/0154972 A1* | 6/2017 | Hsieh | ............... H01L 29/66545 |
| 2017/0162396 A1 | 6/2017 | Tsai et al. | |

* cited by examiner

SEMICONDUCTOR DEVICE HAVING A CAPPING PATTERN ON A GATE ELECTRODE

CROSS-REFERENCE TO RELATED APPLICATIONS

This U.S. non-provisional application is a continuation of U.S. patent application Ser. No. 15/990,983, filed May 29, 2018, in the U.S. Patent and Trademark Office, which claims the benefit of priority under 35 U.S.C. § 119 to Korean Patent Application No. 10-2017-0161937, filed on Nov. 29, 2017, in the Korean Intellectual Property Office, the entire contents of both of which are hereby incorporated by reference.

BACKGROUND

This disclosure relates to a semiconductor device, and more particularly, to a semiconductor device including a field effect transistor and a method of manufacturing the same.

A semiconductor device includes an integrated circuit consisting of metal oxide semiconductor field effect transistors (MOSFETs). As sizes and design rules of semiconductor devices are gradually decreased, sizes of the MOSFETs are also increasingly scaled down. The scale down of MOSFETs may deteriorate operating characteristics of the semiconductor device. Accordingly, various research is being developed to fabricate a semiconductor device having excellent performances while overcoming limitations due to integration of the semiconductor device.

SUMMARY

Some embodiments provide a semiconductor device having improved electrical characteristics and a method of manufacturing the same.

Some embodiments provide a semiconductor device and a method of manufacturing the same in which the method maintains a process margin.

According to exemplary embodiments, the disclosure is directed to a semiconductor device comprising: a gate electrode on a substrate; an upper capping pattern on the gate electrode; and a lower capping pattern between the gate electrode and the upper capping pattern, wherein the lower capping pattern comprises: a first portion between the gate electrode and the upper capping pattern; and a plurality of second portions extending from the first portion onto corresponding side surfaces of the upper capping pattern, wherein the upper capping pattern covers a topmost surface of each of the second portions.

According to exemplary embodiments, the disclosure is directed to a semiconductor device comprising: a gate electrode on a substrate; an upper capping pattern on the gate electrode; a lower capping pattern between the gate electrode and the upper capping pattern; and an interlayer dielectric layer on the substrate and covering the gate electrode, the upper capping pattern, and the lower capping pattern, wherein a top surface of the upper capping pattern is located at the same height relative to the substrate in a vertical direction as that of a top surface of the interlayer dielectric layer, and wherein a topmost surface of the lower capping pattern is located at a lower height relative to the substrate in the vertical direction than that of the top surface of the interlayer dielectric layer.

According to exemplary embodiments, the disclosure is directed to a method of manufacturing a semiconductor device, the method comprising: forming on a substrate a sacrificial gate pattern and an interlayer dielectric layer covering the sacrificial gate pattern; removing the sacrificial gate pattern to form a gap in the interlayer dielectric layer; forming a gate electrode in the gap; forming on the interlayer dielectric layer a lower capping layer covering an inner surface of the gap and a top surface of the gate electrode; forming in the gap a mask pattern covering a portion of the lower capping layer; removing other portions of the lower capping layer to form a lower capping pattern in the gap, wherein the other portions of the lower capping layer are not covered with the mask pattern; and forming an upper capping pattern filling a remainder of the gap.

DETAILED DESCRIPTION

Hereinafter, some embodiments will be described in detail in conjunction with the accompanying drawings to aid in clearly understanding inventive concepts.

Figure 1:
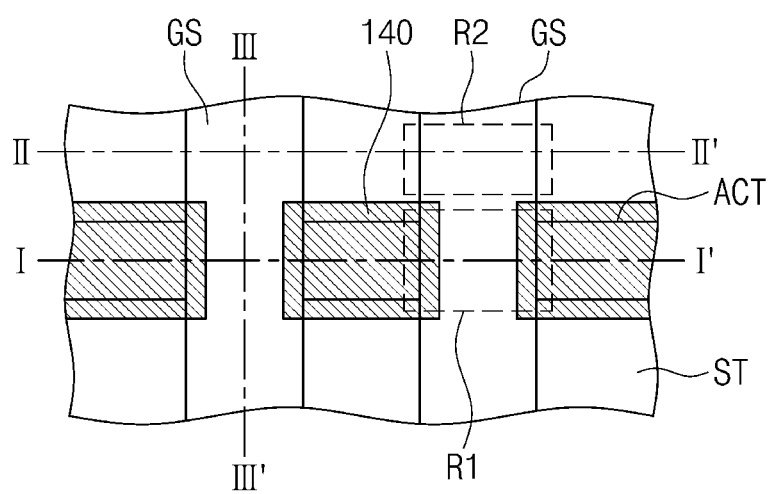
FIG. 1 illustrates a plan view showing a semiconductor device, according to exemplary embodiments.
Figure 1:
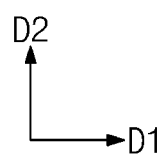
Figure 2:
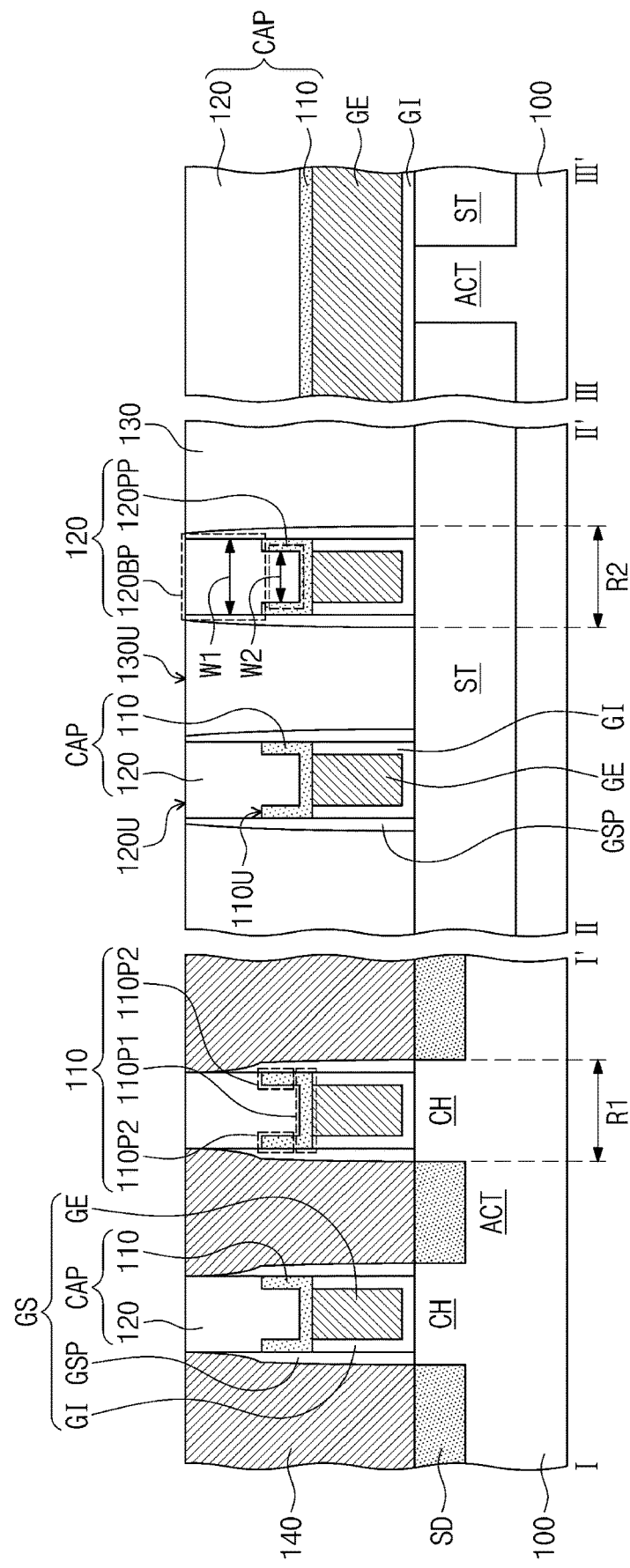
FIG. 2 illustrates a cross-sectional view taken along lines I-I', II-II', and III-III' of FIG. 1.

FIG. 1 illustrates a plan view showing a semiconductor device, according to exemplary embodiments. FIG. 2 illustrates a cross-sectional view taken along lines I-I', II-II', and III-III' of FIG. 1 FIG. 3 illustrates a perspective view showing a gate structure of FIG. 1.

Figure 3:
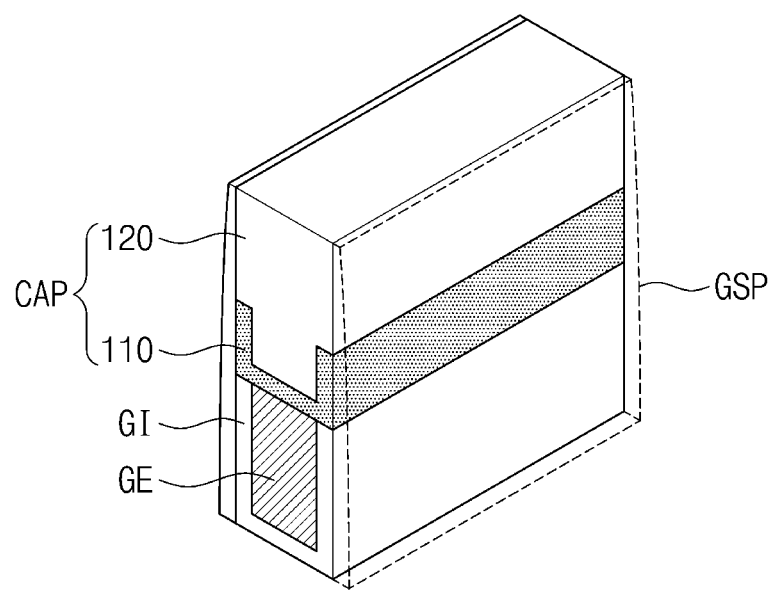
FIG. 3 illustrates a perspective view showing a gate structure of FIG. 1.

Referring to FIGS. 1 to 3, a substrate 100 may be provided thereon with a device isolation layer ST defining an active pattern ACT. The substrate 100 may be or may include a silicon substrate, a germanium substrate, or a silicon-on-insulator (SOI) substrate. The device isolation layer ST may include, for example, oxide, nitride, or oxynitride. The active pattern ACT may extend in a direction D1 parallel to a top surface of the substrate 100. In some embodiments, as illustrated in FIG. 2, the device isolation layer ST may have a top surface substantially coplanar with that of the active pattern ACT. In other embodiments, different from that shown in FIG. 2, the device isolation layer ST may expose side surfaces of an upper portion of the active pattern ACT. In this case, the active pattern ACT may include an upper portion (or fin) exposed by the device isolation layer ST.

The substrate 100 may be provided thereon with a gate structure GS running across the active pattern ACT. The gate structure GS may extend in a second direction D2 parallel to the top surface of the substrate 100. The first direction D1 and the second direction D2 may intersect each other and be perpendicular to one another. The gate structure GS may be provided in plural on the substrate 100, The plurality of gate structures GS may extend across the active pattern ACT, and may be spaced apart from each other along the first direction D1.

The gate structure GS may include a gate electrode GE extending across the active pattern ACT, a capping pattern CAP on the gate electrode GE, a gate dielectric pattern GI between the gate electrode GE and the substrate 100, and gate spacers GSP on side surfaces of the gate electrode GE. The gate electrode GE may have a linear shape extending in the second direction D2. The gate spacers GSP may be correspondingly provided on opposite side surfaces of the gate electrode GE, and each of the gate spacers GSP may extend in the second direction D2 along a corresponding side surface of the gate electrode GE. The gate dielectric pattern GI may extend in the second direction D2 along a bottom surface of the gate electrode GE, and may extend in the second direction D2 along side surfaces of the gate electrode GE between the gate electrode GE and each of the gate spacers GSP. The gate electrode GE may include one or more of conductive metal nitride (e.g., titanium nitride, tantalum nitride, etc.) and metal (e.g., aluminum, tungsten, etc.). The gate electrode GE may include metallic materials having different work functions from each other. The gate dielectric pattern GI may include at least one of high-k dielectric layers. For example, the gate dielectric pattern GI may include one or more of hafnium oxide, hafnium silicate, zirconium oxide, and zirconium silicate. The gate spacers GSP may include nitride silicon nitride).

The capping pattern CAP may extend in the second direction D2 along a top surface of the gate electrode GE. The capping pattern CAP may include an upper capping pattern 120 on the gate electrode GE and a lower capping pattern 110 between the gate electrode GE and the upper capping pattern 120. Each of the lower capping pattern 110 and the upper capping pattern 120 may extend in the second direction D2 along the top surface of the gate electrode GE, when viewed in a plan view. The lower capping pattern 110 may separate the upper capping pattern 120 from the gate electrode GE. For example, the upper capping pattern 120 may be spaced apart from the gate electrode GE across the lower capping pattern 110 in a vertical direction. The capping pattern CAP may further include a boundary between the upper capping pattern 120 and the lower capping pattern 110, and the boundary between the upper capping pattern 120 and the lower capping pattern 110 may include an oxide.

The lower capping pattern 110 may include a first portion 110P1 between the gate electrode GE and the upper capping pattern 120 in a horizontal direction and second portions 110P2 extending from the first portion 110P1 onto corresponding side surfaces of the upper capping pattern 120 in a vertical direction. The second portions 110P2 of the lower capping pattern 110 may be correspondingly provided on opposite side surfaces of the upper capping pattern 120, and each of the second portions 110P2 may extend in the second direction D2 along a corresponding side surface of the upper capping pattern 120. The topmost surface of the lower capping pattern 110 may be a topmost surface of each of the second portions 110P2. In other embodiments, different from that shown, each of the second portions 110P2 of the lower capping pattern 110 may have a shape that is tapered in a direction away from the substrate 100. For example, each of the second portions 110P2 may have a width in the first direction D1, and the width in the first direction D1 of each of the second portions 110P2 may decrease along the direction away from the substrate 100 (i.e., in a vertical direction). The lower capping pattern 110 may be shaped like U when viewed in cross-section. The gate dielectric pattern GI may extend between each of the gate spacers GSP and the gate electrode GE, thereby being in contact with the lower capping pattern 110. For example, topmost surfaces of the gate dielectric pattern GI may contact a lower surface of the lower capping pattern 110 at region below the second portions 110P2.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" another element, there are no intervening elements present. Other words used to describe the relationship between elements should be interpreted in a like fashion (e.g., "between" versus "directly between," "adjacent" versus "directly adjacent," etc.). However, the term "contact," or "in contact with," as used herein refers to a direct connection (i.e., touching) unless the context indicates otherwise.

The upper capping pattern 120 may cover topmost surfaces 110U of the lower capping pattern 110. For example, the upper capping pattern 120 may cover the topmost surface 110U of each of the second portions 110P2 of the lower capping pattern 110. The upper capping pattern 120 may be in contact with the topmost surfaces 110U of the lower capping pattern 110. The topmost surfaces 110U of the lower capping pattern 110 may be located at a lower height relative to the substrate 100 in a vertical direction than that of a top surface 120U of the upper capping pattern 120. A portion of the upper capping pattern 120 may be interposed between the second portions 110P2 of the lower capping pattern 110. The portion of the upper capping pattern 120 may fill a space between the second portions 110P2 of the lower capping pattern 110.

The upper capping pattern 120 may include a body 120BP and a protrusion 120PP that protrudes from the body 120BP toward the substrate 100. The body 120BP may have a first width W1, and the protrusion 120PP may have a second width W2 less than the first width W1. The first width W1 may be a maximum width of the body 120BP when measured along the first direction D1, and the second width W2 may be a maximum width of the protrusion 120PP when measured along the first direction D1. In the example illustrated in HG. 2, the widths of the body 120BP and the protrusion 120PP may be constant widths in the vertical direction. In some embodiments, different from that shown, when each of the second portions 110P2 of the lower capping pattern 110 has a shape that is tapered in the direction away from the substrate 100 in a vertical direction, the second width W2 of the protrusion 120PP may increase in the direction away from the substrate 100 in the vertical direction. The protrusion 120PP of the upper capping pattern 120 may be interposed between the second portions 110P2 of the lower capping pattern 110, and the body 120BP of the upper capping pattern 120 may cover the topmost surface 110U of each of the second portions 110P2 of the lower capping pattern 110. The body 120BP of the upper capping pattern 120 may be in contact with the topmost surface 110U of each of the second portions 110P2 of the lower capping pattern 110. The topmost surface 110U of the lower capping pattern 110 may be located at a lower height relative to the substrate 100 in the vertical direction than that of the top surface 120U of the body 120BP of the upper capping pattern 120. Each of the lower capping pattern 110 and the upper capping pattern 120 may include nitride (e.g., silicon nitride).

Source/drain regions SD may be provided in the active pattern ACT on opposite sides of the gate structure GS. For example, the source/drain regions SD may be formed between neighboring ones of the gate spacers GSP in the active pattern ACT. The active pattern ACT may have a portion that is positioned below the gate structure GS and overlaps the gate structure GS in the vertical direction, and that portion of the active pattern ACT may be used as a channel region CH. An interlayer dielectric layer 130 may be provided on the substrate 100, covering the gate structure GS and the source/drain regions SD. The interlayer dielectric layer 130 may have a top surface 130U substantially coplanar with the top surface 120U of the upper capping pattern 120 (or with the top surface 120U of the body 120BP of the upper capping pattern 120). For example, the top surface 130U of the interlayer dielectric layer 130 may be at the same vertical height as the top surface 120U of the upper capping pattern 120. The topmost surface 110U of the lower capping pattern 110 (or the topmost surface 110U of each of the second portions 110P2 of the lower capping pattern 110) may be located at a lower height relative to the substrate 100 in the vertical direction than that of the top surface 130U of the interlayer dielectric layer 130. The interlayer dielectric layer 130 may include, for example, a silicon oxide layer.

Contacts 140 may be provided on opposite sides of the gate structure GS. The contacts 140 may penetrate the interlayer dielectric layer 130 to come into electrical connection with the substrate 100. The contacts 140 may be electrically connected to corresponding source/drain regions SD on the opposite sides of the gate structure GS. The contacts 140 may include one or more of doped semiconductor, metal, metal silicide, and conductive metal nitride.

The gate structure GS may include a first region R1 whose opposite sides are provided with the contacts 140, and a second region R2 whose opposite sides are provided without the contacts 140. At the first region R1 of the gate structure GS, the upper capping pattern 120 may be in contact with the contacts 140. For example, at the first region R1 of the gate structure GS, the body 120BP of the upper capping pattern 120 may be in contact with the contacts 140. At the second region R2 of the gate structure GS, the gate spacers GSP may extend onto corresponding side surfaces of the capping pattern CAP, and a topmost surface of each of the gate spacers GSP may be substantially coplanar with the top surface 130U of the interlayer dielectric layer 130. In some embodiments, the gate spacers GSP may have a shape that tapers as the gate spacers GSP come closer to the top surface 130U of the interlayer dielectric layer 130. Each of the gate spacers GSP may be interposed between the capping pattern CAP and the interlayer dielectric layer 130 and may be in contact with the capping pattern CAP. For example, at the second region R2 of the gate structure GS, each of the second portions 110P2 of the lower capping pattern 110 may be interposed between the protrusion 120PP of the upper capping pattern 120 and each of the gate spacers GSP, while being in contact with each of the gate spacers GSP. At the second region R2 of the gate structure GS, the body 120BP of the upper capping pattern 120 may be in contact with the gate spacers GSP.

The gate structure GS and the source/drain regions SD may constitute a field effect transistor. For example, the gate structure GS and the source/drain regions SD may constitute a P-type field effect transistor. Although not shown, the interlayer dielectric layer 130 may be provided thereon with wiring lilies connected to the contacts 140. The wiring lines (not shown) may be electrically connected through the contacts 140 to the source/drain regions SD.

FIGS. 4 to 10 illustrate cross-sectional views taken along lines I-I', II-II', and III-III' of FIG. 1, showing a method of manufacturing a semiconductor device, according to exemplary embodiments.

Figure 4:
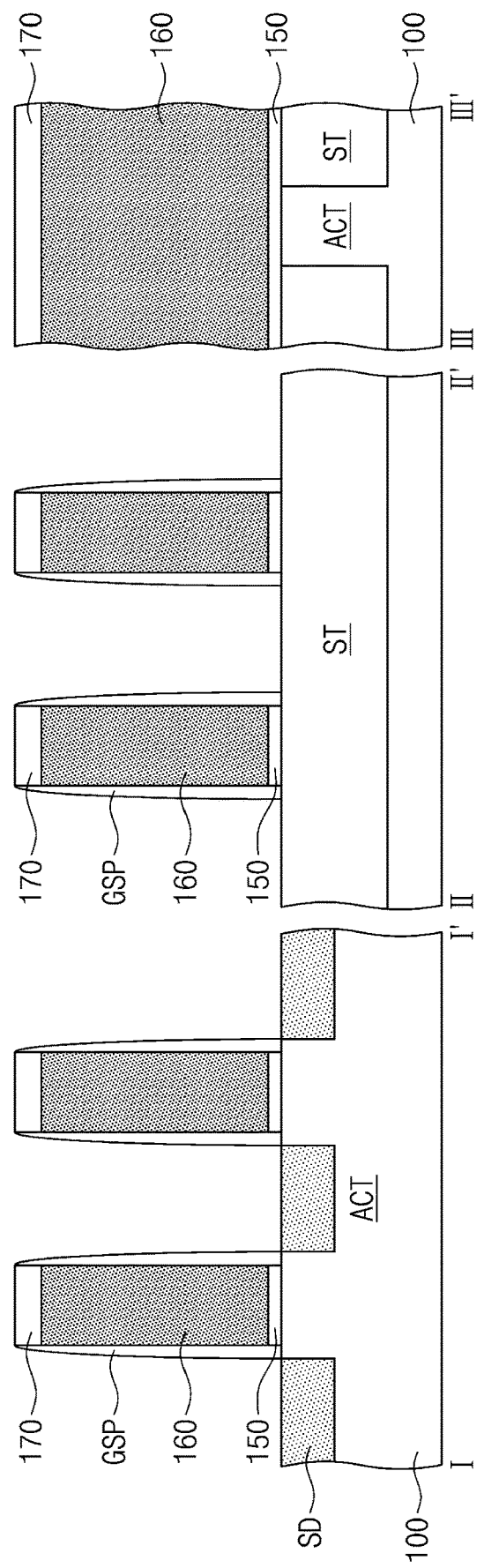
FIGS. 4 to 10 illustrate cross-sectional views taken along lines I-I', II-II', and III-III' of FIG. 1, showing a method of manufacturing a semiconductor device, according to exemplary embodiments.

Referring to FIG. 4, a device isolation layer ST may be formed on a substrate 100 to define an active pattern ACT. An STI (Shallow Trench Isolation) process may be used to form the device isolation layer ST. The active pattern ACT may be formed to extend in a first direction D1.

An etch stop layer (not shown) and a sacrificial gate layer (not shown) may be sequentially formed on the substrate 100. The etch stop layer may include, for example, a silicon oxide layer. The sacrificial gate layer may include a material having an etch selectivity to the etch stop layer. The sacrificial gate layer may include, for example, polysilicon. The sacrificial gate layer may be patterned to form a sacrificial gate pattern 160. The sacrificial gate pattern 160 may be formed to extend in a second direction D2 and to run across the active pattern ACT. The formation of the sacrificial gate pattern 160 may include forming a gate mask pattern 170 on the sacrificial gate layer and etch the sacrificial gate layer by using the gate mask pattern 170 as an etching mask. The gate mask pattern 170 may include, for example, silicon nitride. The etching of the sacrificial gate layer may include performing an etching process having an etch selectivity to the etch stop layer. After the sacrificial gate pattern 160 is formed, the etch stop layer may be removed from opposite sides of the sacrificial gate pattern 160 such that an etch stop pattern 150 may be formed below the sacrificial gate pattern 160. The etch stop pattern 150 may extend in the second direction D2 along a bottom surface of the sacrificial gate pattern 160.

Gate spacers GSP may be correspondingly formed on side surfaces of the sacrificial gate pattern 160, The gate spacers GSP may include, for example, silicon nitride. The formation of the gate spacers GSP may include forming a gate spacer layer (not shown) the substrate 100 on which the sacrificial gate pattern 160 is formed and anisotropically etching the gate spacer layer.

Source/drain regions SD may be formed in the active pattern ACT on opposite sides of the sacrificial gate pattern 160. The formation of the source/drain regions SD may include, for example, performing a selective epitaxial growth process to form epitaxial patterns in the active pattern ACT on opposite sides of the sacrificial gate pattern 160. Alternatively, the formation of the source/drain regions SD may include performing an ion implantation process to form impurity-doped regions in the active pattern ACT on opposite sides of the sacrificial gate pattern 160.

Figure 5:
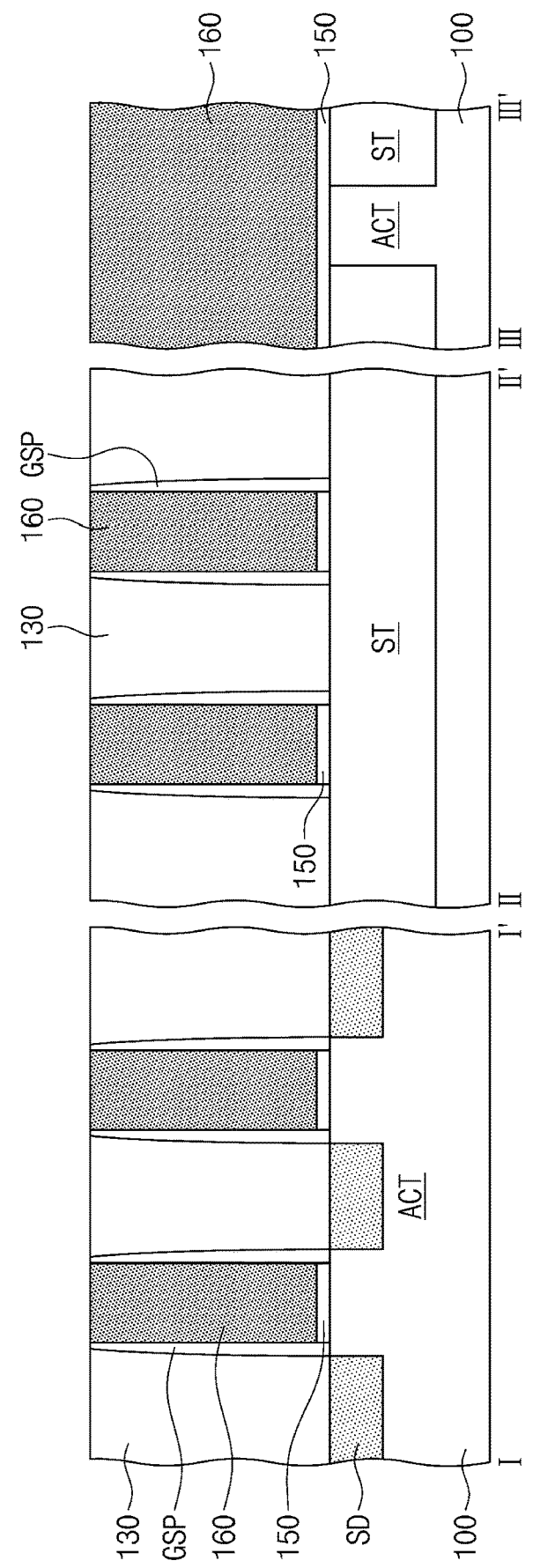

Referring to FIG. 5, an interlayer dielectric layer 130 may be formed on the substrate 100 to cover the sacrificial gate pattern 160 and the source/drain regions SD. The interlayer dielectric layer 130 may include, for example, silicon oxide. The interlayer dielectric layer 130 may be planarized to expose a top surface of the sacrificial gate pattern 160 and top surfaces of the gate spacers GSP. The gate mask pattern 170 may be removed when the interlayer dielectric layer 130 is planarized.

Figure 6:
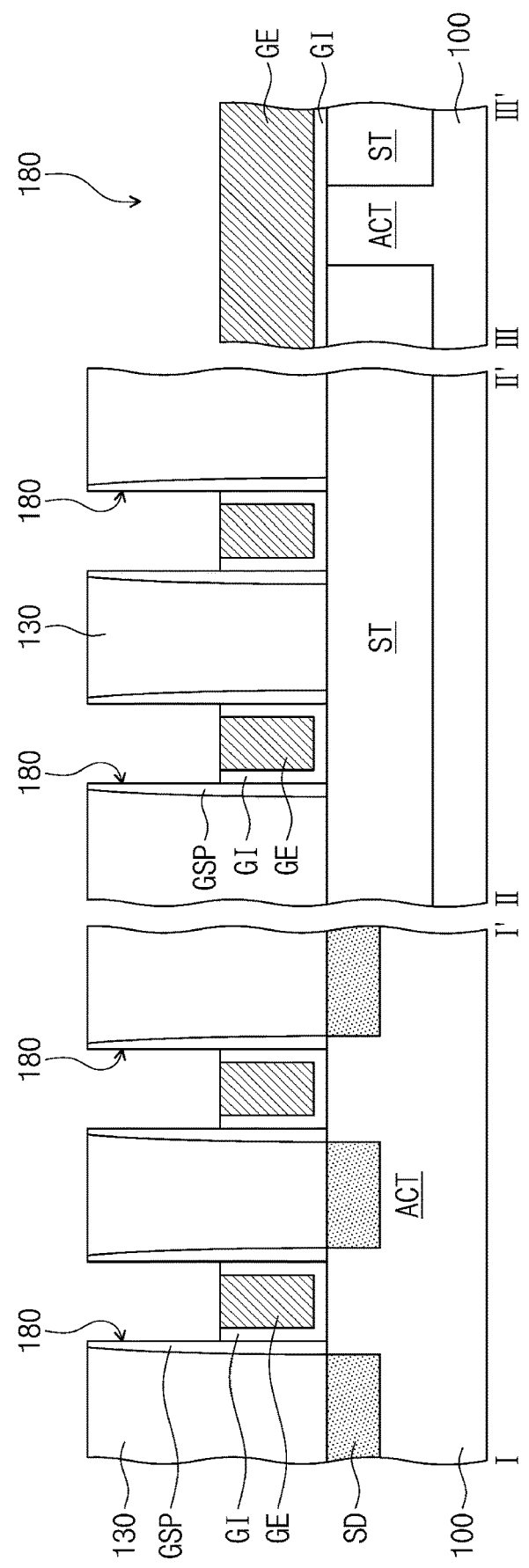

Referring to FIG. 6, the sacrificial gate pattern 160 and the etch stop pattern 150 may be removed. Accordingly, a gap 180 may be formed between the gate spacers GSP in the interlayer dielectric layer 130. For example, the gap 180 may be formed between each pair of gate spacers GSP. The formation of the gap 180 may include etching the sacrificial gate pattern 160 and the etch stop pattern 150 by performing an etching process having an etch selectivity to the interlayer dielectric layer 130 and the gate spacers GSP.

A gate dielectric pattern GI and a gate electrode GE may be formed in the gap 180. For example, the formation of the gate dielectric pattern GI and the gate electrode GE may include forming on the interlayer dielectric layer 130 a gate dielectric layer (not shown) partially filling the gap 180, forming on the gate dielectric layer a gate electrode layer (not shown) completely filling the gap 180, and planarizing the gate dielectric layer and the gate electrode layer until a top surface of the interlayer dielectric layer 130 is exposed. The planarization process may expose the top surfaces of the gate spacers GSP. The gate electrode layer may be etched on its upper portion until the gate electrode layer reaches a desired thickness in the gap 180, to form the gate electrode GE. In addition, the gate dielectric layer may be etched on its upper portion not covered with the gate electrode GE, to form the gate dielectric pattern GI. The gate dielectric pattern GI may be interposed between the gate electrode GE and the substrate 100, and may extend between the gate electrode GE and each of the gate spacers GSP. In some embodiments, the gate dielectric pattern GI may have a topmost surface at substantially the same level relative to the substrate 100 in the vertical direction as that of a top surface of the gate electrode GE. The gate electrode GE and the gate dielectric pattern GI may fill a lower portion of the gap 180.

Figure 7:
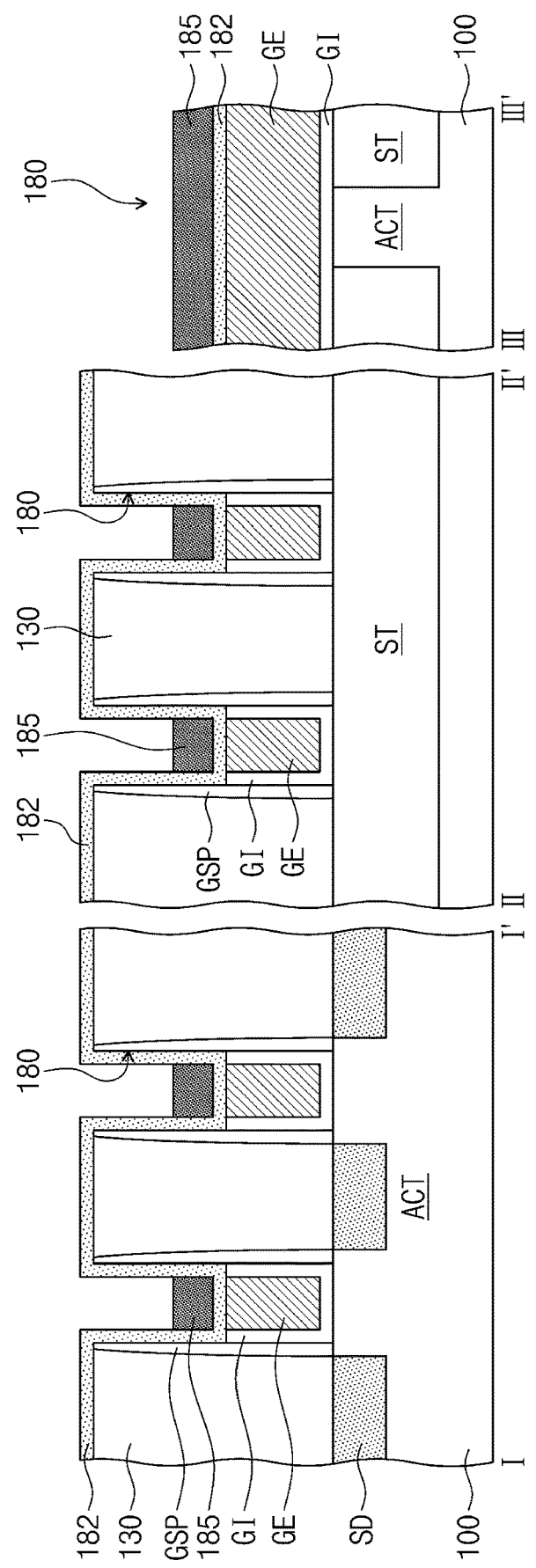

Referring to FIG. 7, a lower capping layer 182 may be formed on the interlayer dielectric layer 130 to partially fill an upper portion of the gap 180. The lower capping layer 182 may be formed to conformally cover an inner surface of the upper portion of the gap 180, the top surface of the gate electrode GE, the topmost surface of the gate dielectric pattern GI. The formation of the lower capping layer 182 may include performing a first deposition process under an atmosphere whose $H_2$ plasma density is relatively low. For example, the first deposition process may include indirect $H_2$ plasma treatment or not include $H_2$ plasma treatment. The first deposition process may be or may include an atomic layer deposition process performed under an atmosphere whose $H_2$ plasma density is relatively low. The lower capping layer 182 may include, for example, silicon nitride.

A mask pattern 185 may be formed in the gap 180 to cover a portion of the lower capping layer 182. The formation of the mask pattern 185 may include forming a mask layer filling the reminder of the upper portion of the gap 180 and etching the mask layer until the mask layer reaches a desired thickness in the vertical direction in the upper portion of the gap 180. The mask pattern 185 may include, for example, a spin-on-hardmask (SOH) material (e.g., a carbon-containing layer).

Figure 8:
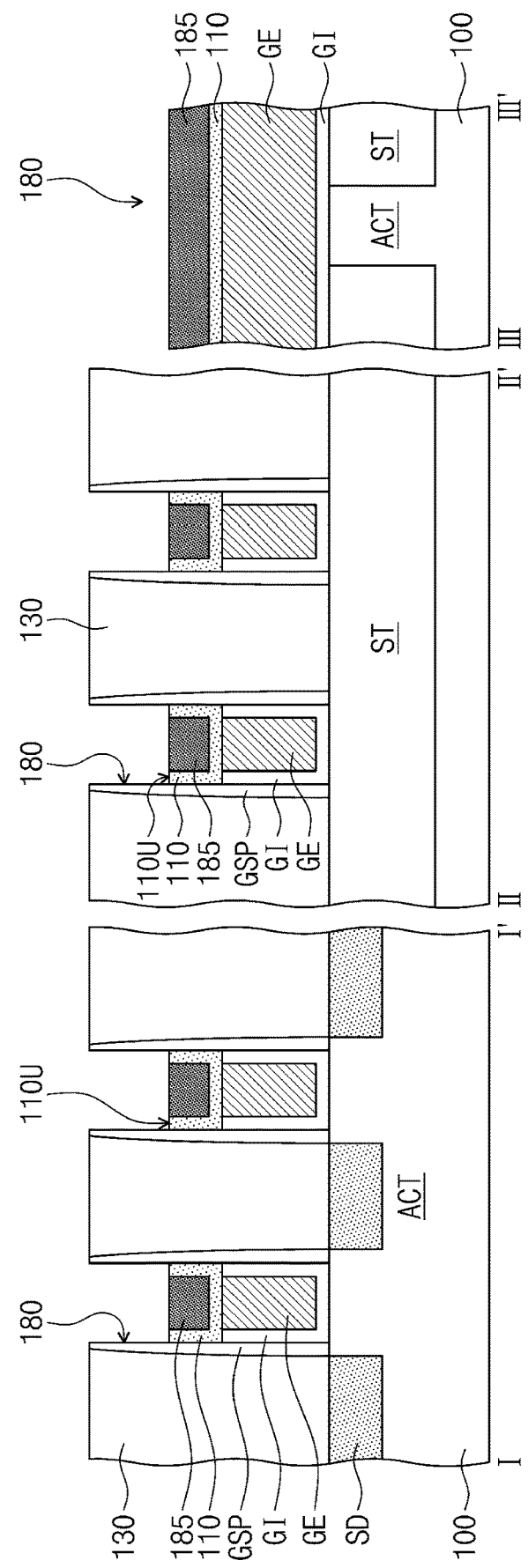

Referring to FIG. 8, other portions of the lower capping layer 182, which is not covered with the mask pattern 185, may be removed to form a lower capping pattern 110. The lower capping pattern 110 may be interposed between the mask pattern 185 and the gate electrode GE and between the mask pattern 185 and the gate dielectric pattern GI, and may extend between the mask pattern 185 and each of the gate spacers GSP. A topmost surface 110U of the lower capping pattern 110 may be located at substantially the same level relative to the substrate 100 in the vertical direction as that of a top surface of the mask pattern 185.

Figure 9:
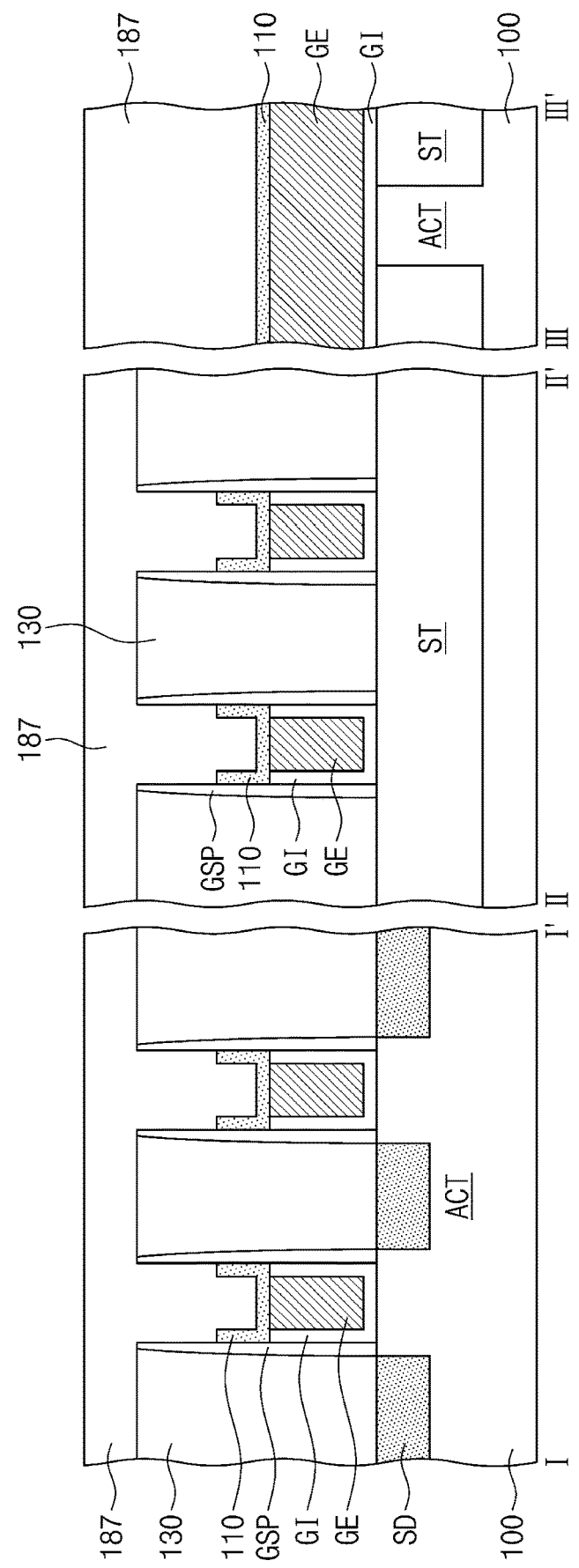

Referring to FIG. 9, the mask pattern 185 may be removed. The mask pattern 185 may be removed by performing an ashing process and/or a strip process. After the mask pattern 185 is removed, an upper capping layer 187 may be formed on the interlayer dielectric layer 130 to fill the remainder of the gap 180. The formation of the upper capping layer 187 may include performing a second deposition process under an atmosphere whose $H_2$ plasma density is relatively high. For example, the second deposition process may include direct $H_2$ plasma treatment. The second deposition process may be or may include an atomic layer deposition process performed under an atmosphere whose $H_2$ plasma density is relatively high. The upper capping layer 187 may include, for example, silicon nitride. As the second deposition process is performed under an atmosphere whose $H_2$ plasma density is relatively higher than that of an atmosphere under which the first deposition process is performed, the upper capping layer 187 may have an impurity content less than that of the lower capping layer 182. Accordingly, the upper capping layer 187 may be formed to have a density greater than that of the lower capping layer 182.

Figure 10:
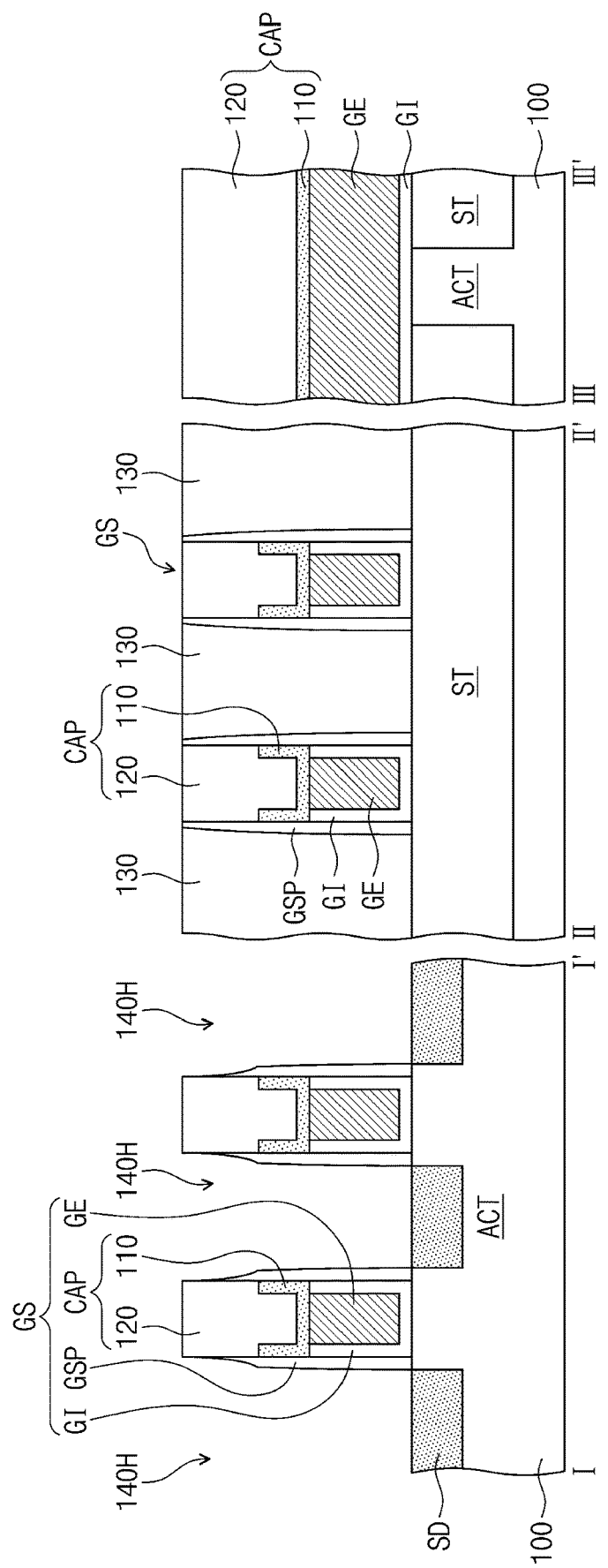

Referring to FIG. 10, the upper capping layer 187 may be planarized until the interlayer dielectric layer 130 is exposed. As a result of the planarization process, an upper capping pattern 120 may be formed locally in the gap 180. The lower capping pattern 110 and the upper capping pattern 120 may constitute a capping pattern CAP. A gate structure GS may be constituted or formed by the gate electrode GE, the gate dielectric pattern GI, the capping pattern CAP, and the gate spacers GSP.

Contact holes 140H may be formed in the interlayer dielectric layer 130 on opposite sides of the gate structure GS. The contact holes 140H may expose the source/drain regions SD on opposite sides of the gate structure GS. The formation of the contact holes 140H may include performing an etching process to etch the interlayer dielectric layer 130 under an etching condition that has an etch selectivity to the capping pattern CAP and the gate spacers GSP. As the upper capping layer 187 is formed to have a density greater than that of the lower capping layer 182, when the etching process is performed to form the contact holes 140H, the upper capping pattern 120 may exhibit etching resistance greater than that of the lower capping pattern 110.

In general, a capping pattern on a gate electrode may be formed as a single pattern including silicon nitride. The capping pattern may be formed by a deposition process performed under an atmosphere whose $H_2$ plasma density is relatively high. In this case, when the deposition process is performed, hydrogen may diffuse into the gate electrode, and as a result, it may be difficult to control a threshold voltage of the gate electrode.

According to certain embodiments, the capping pattern CAP may be formed as a multi-layered structure including the upper capping pattern 120 and the lower capping pattern 110. The upper capping pattern 120 may be formed by the second deposition process performed under an atmosphere whose $H_2$ plasma density is relatively high, and the lower capping pattern 110 may be formed by the first deposition process performed under an atmosphere whose $H_2$ plasma density is relatively low. In this case, hydrogen may minimize or decrease in diffusion into the gate electrode GE during the first deposition process, and thereafter the lower capping pattern 110 may suppress or prevent hydrogen from diffusing into the gate electrode GE during the second deposition process for forming the upper capping pattern 120. Accordingly, it may be easier to control a threshold voltage of the gate electrode GE.

In addition, when the etching process is performed to form the contact holes 140H, the upper capping pattern 120 may exhibit etching resistance greater than that of the lower capping pattern 110. The upper capping pattern 120 may be formed to cover the topmost surface 110U of the lower capping pattern 110, and in this case, the lower capping pattern 110 may be least exposed during the etching process for forming the contact holes 140H. Accordingly, during the etching process for forming the contact holes 140H, it may be possible to minimize or prevent loss of the capping pattern CAP and to keep a process margin for the etching process.

Consequently, not only a process margin may be securely obtained in manufacturing a semiconductor device, but the semiconductor device may have improvement in electrical characteristics.

Referring back to FIGS. 1 and 2, contacts 140 may be formed in the contact holes 140H. The formation of the contacts 140 may include forming on the interlayer dielectric layer 130 a conductive layer filling the contact holes 140H and planarizing the conductive layer until the interlayer dielectric layer 130 is exposed. The contacts 140 may include one or more of, for example, doped semiconductor, metal, metal silicide, and conductive metal nitride. Although not shown, wiring lines (not shown) may be formed on the interlayer dielectric layer 130 to come into connection with the contacts 140. The wiring lines may be electrically connected through the contacts 140 to the source/drain regions SD.

Figure 11:
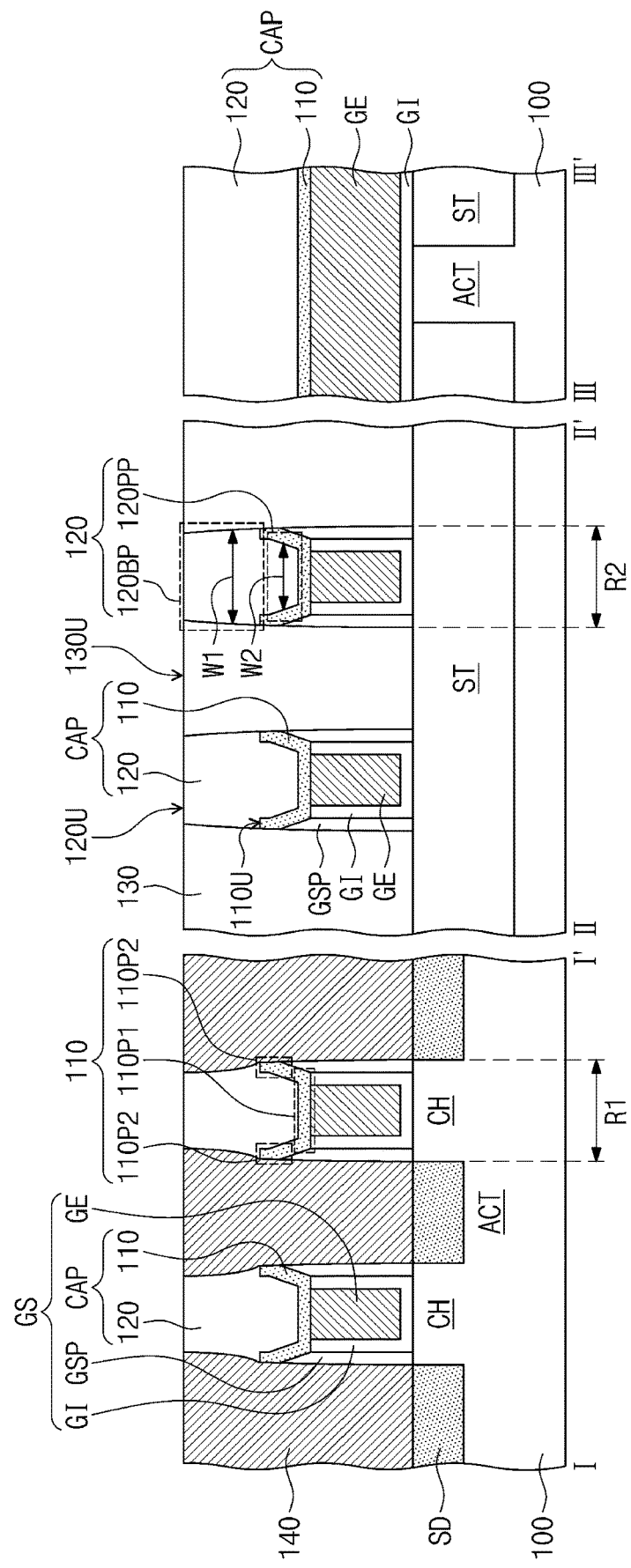
FIG. 11 illustrates a cross-sectional view taken along lines I-I', II-II', and III-III' of FIG. 1, showing a semiconductor device, according to exemplary embodiments.

FIG. 11 illustrates a cross-sectional view taken along lines I-I', II-II', and III-III' of FIG. 1, showing a semiconductor device, according to exemplary embodiments. For brevity of explanation, the following description will focus on differences from the semiconductor device discussed with reference to FIGS. 1 to 3.

Referring to FIGS. 1 and 11, the capping pattern CAP may include the upper capping pattern 120 and the lower capping pattern 110. The upper capping pattern 120 may be spaced apart from the gate electrode GE across the lower capping pattern 110. In addition, the upper capping pattern 120 may be spaced apart from each of the gate spacers GSP across the lower capping pattern 110. For example, the lower capping pattern 110 may be between the upper capping pattern 120 and the gate electrode GE and between the upper capping pattern 120 and the gate spacers GSP.

The lower capping pattern 110 may include the first portion 110P1 between the gate electrode GE and the upper capping pattern 120 and the second portions 110P2 extending from the first portion 110P1 onto corresponding side surfaces of the upper capping pattern 120. The lower capping pattern 110 may be shaped like U when viewed in cross-section. The gate dielectric pattern GI may extend between each of the gate spacers GSP and the gate electrode GE, thereby being in contact with the lower capping pattern 110. For example, topmost surfaces of the gate dielectric pattern GI may be in contact with a lower surface of the lower capping pattern 110. Further, each of the gate spacers GSP may have a topmost surface in contact with the lower capping pattern 110. In some embodiments, the topmost surface of the gate spacers GSP may be a slanted surface that extends from one side surface of the gate spacer GSP to another side surface of the gate spacer GSP and faces the lower capping pattern 110.

The upper capping pattern 120 may include the body 120BP and the protrusion 120PP that protrudes from the body 120BP toward the substrate 100. The body 120BP may have the first width W1, and the protrusion 120PP may have the second width W2 less than the first width W1. In some embodiments, the first width W1 may be a first range of widths and the second width W2 may be a second range of widths, and the first range of widths may be greater than the second range of widths. For example, the body 120BP may have a first width W1 that decreases in a vertical direction (e.g., the first width is greater at a bottom of the body 120BP and smaller at a top of the body 120BP), and the protrusion 120PP may have a second width W2 that increases in the vertical direction (e.g., the second width is smaller at a bottom of the protrusion 120PP and greater at a top of the protrusion 120PP). In this example, the widest first width W1 of the body 120BP is greater than the widest second width W2 of the protrusion 120PP.

The protrusion 120PP of the upper capping pattern 120 may be interposed between the second portions 110P2 of the lower capping pattern 110, and portions of the body 120BP of the upper capping pattern 120 may cover the topmost surface 110U of each of the second portions 110P2 of the lower capping pattern 110. The topmost surface 110U of the lower capping pattern 110 may be located at a lower height relative to the substrate 100 in the vertical direction than that of the top surface 120U of the body 120BP of the upper capping pattern 120. The top surface 130U of the interlayer dielectric layer 130 may be substantially coplanar with the top surface 120U of the upper capping pattern 120 (or with the top surface 120U of the body 120BP of the upper capping pattern 120).

The gate structure GS may include the first region R1 whose opposite sides are provided with the contacts 140 and the second region R2 whose opposite sides are provided without the contacts 140. At the first region R1 of the gate structure GS, the upper capping pattern 120 may be in contact with the contacts 140. For example, at the first region R1 of the gate structure GS, the capping pattern CAP may be in contact with the contacts 140. For example, at the first region R1 of the gate structure GS, each of the second portions 110P2 of the lower capping pattern 110 may be in contact with the contacts 140, and may be interposed between the contacts 140 and the protrusion 120PP of the upper capping pattern 120. The second portions 110P2 of the lower capping pattern. 110 may separate the protrusion 120PP of the upper capping pattern 120 from the contacts 140. At the first region R1 of the gate structure GS, the body 120BP of the upper capping pattern 120 may be in contact with the contacts 140. At the second region R2 of the gate structure GS, the capping pattern. CAP may be in contact with the interlayer dielectric layer 130. For example, at the second region R2 of the gate structure OS, each of the second portions 110P2 of the lower capping pattern 110 may be in contact with the interlayer dielectric layer 130, and may be interposed between the interlayer dielectric layer 130 and the protrusion 120PP of the upper capping pattern 120. The second portions 110P2 of the lower capping pattern 110 may separate the protrusion 120PP of the upper capping pattern 120 from the interlayer dielectric layer 130. At the second region R2 of the gate structure GS, the body 120BP of the upper capping pattern 120 may be in contact with the interlayer dielectric layer 130.

Figure 12:
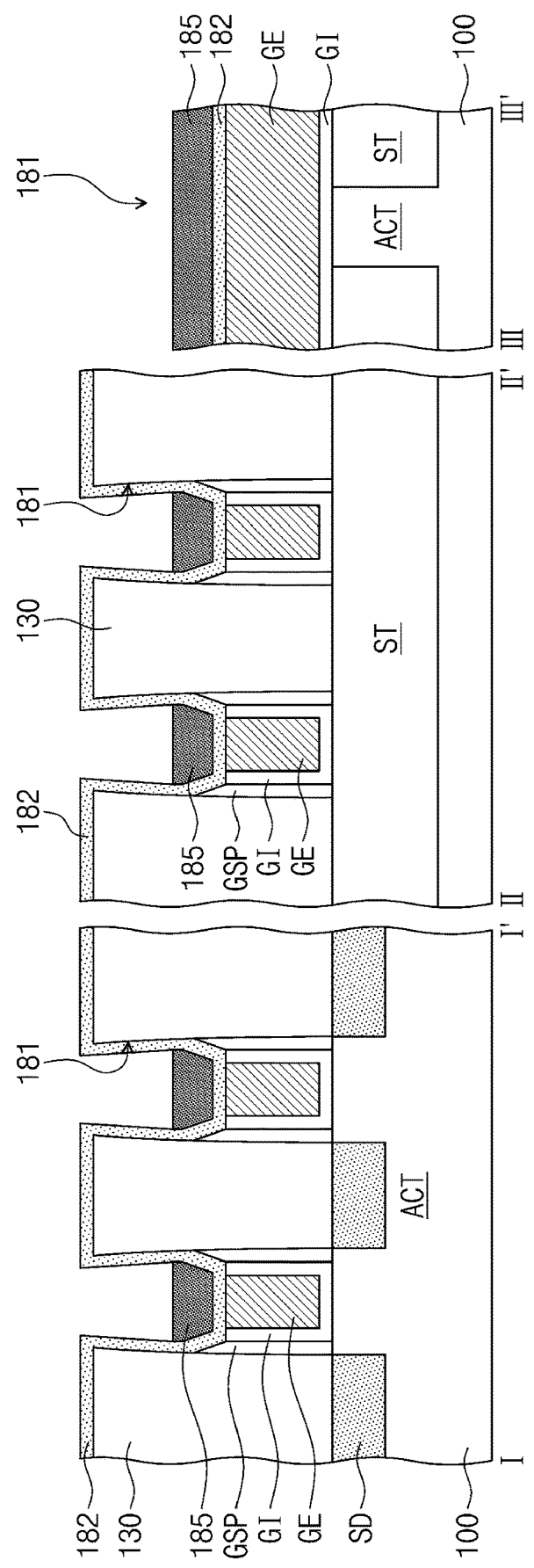
FIGS. 12 and 13 illustrate cross-sectional views taken along lines I-I', II-II', and III-III' of FIG. 1, showing a method of manufacturing a semiconductor device, according to exemplary embodiments.
Figure 13:
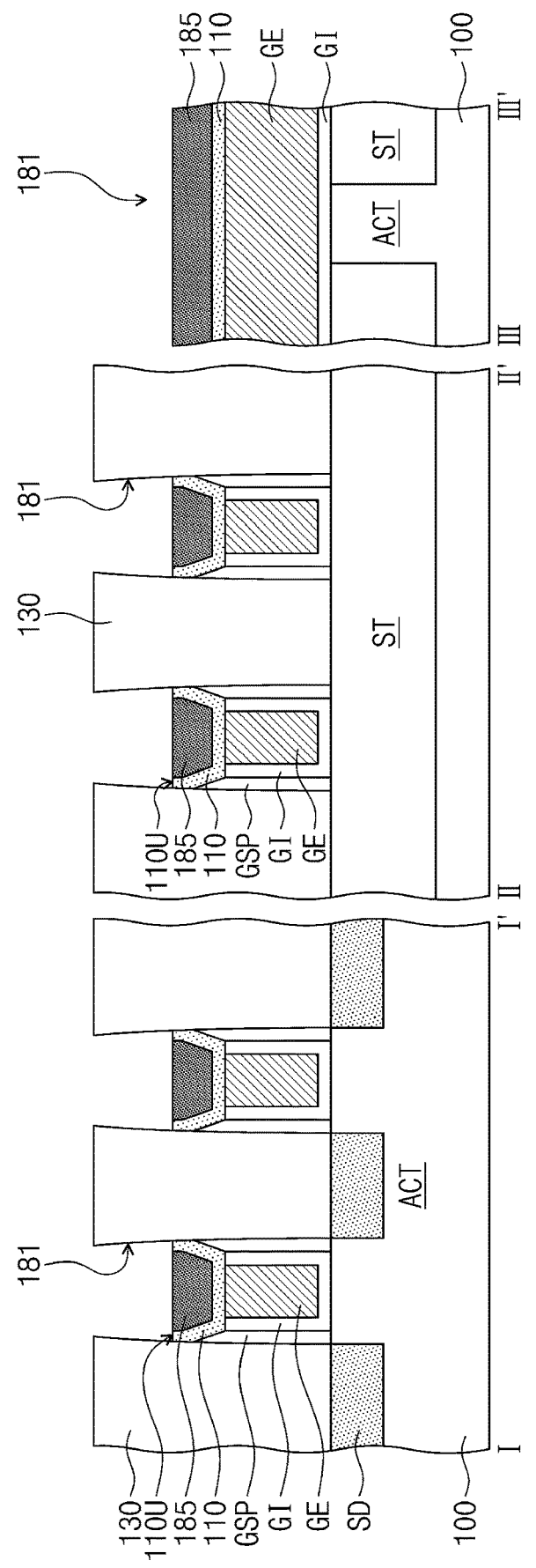

FIGS. 12 and 13 illustrate cross-sectional views taken along lines I-I', II-II', and III-III' of FIG. 1, showing a method of manufacturing a semiconductor device, according to exemplary embodiments. For example, FIGS. 12 and 13 illustrate an exemplary method of manufacturing the semiconductor device of FIG. 11. For brevity of explanation, the following description will focus on differences from the manufacturing method discussed with reference to FIGS. 4 to 10.

As discussed with reference to FIGS. 4 to 6, the substrate 100 may be provided thereon with the device isolation layer ST defining the active pattern ACT and the sacrificial gate pattern 160 running across the active pattern ACT. The etch stop pattern 150 may be formed below the sacrificial gate pattern 160, and the gate spacers GSP may be formed on corresponding side surfaces of the sacrificial gate pattern 160. The source/drain regions SD may be formed in the active pattern ACT on opposite sides of the sacrificial gate pattern 160, and the interlayer dielectric layer 130 may be formed to cover the sacrificial gate pattern 160 and the source/drain regions SD. The sacrificial gate pattern 160 and the etch stop pattern 150 may be removed to form the gap 180 between the gate spacers GSP in the interlayer dielectric layer 130. The gate electrode GE and the gate dielectric pattern GI may be formed to fill a lower portion of the gap 180.

Referring to FIG. 12, upper portions of the gate spacers GSP may be removed, and thus the interlayer dielectric layer 130 may be provided therein with a recess region 181 exposing an inner surface of the interlayer dielectric layer 130. The recess region 181 may be defined by the inner surface of the interlayer dielectric layer 130, a top surface of the gate electrode GE, a topmost surface of the gate dielectric pattern GI, and topmost surfaces of the gate spacers GSP. The removal of the upper portions of the gate spacers GSP may include performing an etching process having an etch selectivity to the interlayer dielectric layer 130, the gate electrode GE, and the gate dielectric pattern GI.

The lower capping layer 182 may be formed on the interlayer dielectric layer 130 to partially fill the recess region 181. The lower capping layer 182 may be formed to conformally cover an inner surface of the recess region 181. The mask pattern 185 may be formed in the recess region 181 to partially cover the lower capping layer 182. The formation of the lower capping layer 182 and the mask pattern 185 may be substantially the same as the manufacturing method discussed with reference to FIG. 7.

Referring to FIG. 13, other portions of the lower capping layer 182, which is not covered with the mask pattern 185, may be removed to form the lower capping pattern 110. The lower capping pattern 110 may be interposed between the mask pattern 185 and the gate electrode GE and between the mask pattern 185 and the gate dielectric pattern GI, and may extend onto side surfaces of the mask pattern 185. The topmost surface 110U of the lower capping pattern 110 may be located at substantially the same level relative to the substrate 100 in the vertical direction as that of a top surface of the mask pattern 185.

Subsequent processes may be substantially the same as the manufacturing method discussed with reference to FIGS. 2, 9, and 10.

Figure 14:
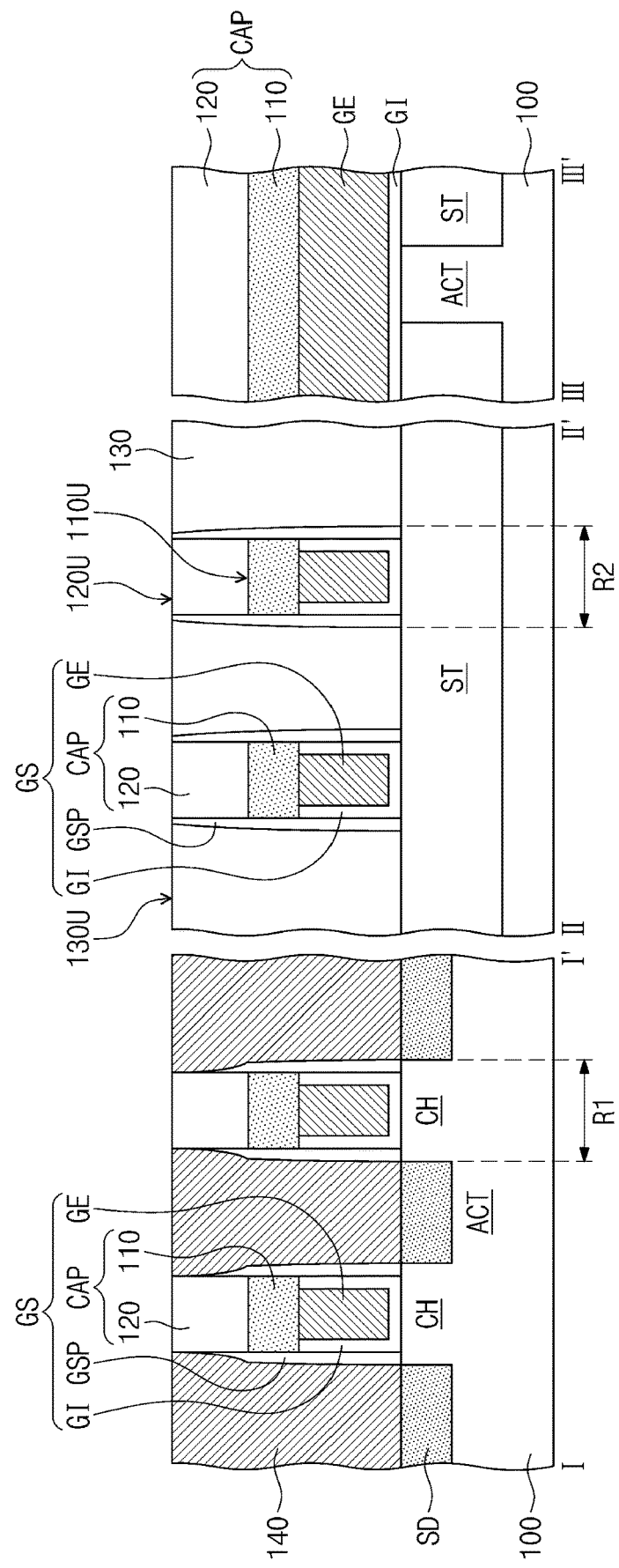
FIG. 14 illustrates a cross-sectional view taken along lines I-I', II-II', and III-III' of FIG. 1, showing a semiconductor device, according to exemplary embodiments.

FIG. 14 illustrates a cross-sectional view taken along lines I-I', II-II', and III-III' of FIG. 1, showing a semiconductor device, according to exemplary embodiments. For brevity of explanation, the following description will focus on differences from the semiconductor device discussed with reference to FIGS. 1 to 3.

Referring to FIGS. 1 and 14, the capping pattern. CAP may include the upper capping pattern 120 on the gate electrode GE and the lower capping pattern 110 between the gate electrode GE and the upper capping pattern 120. Each of the lower capping pattern 110 and the upper capping pattern 120 may extend in the second direction D2 along the top surface of the gate electrode GE, when viewed in plan. The upper capping pattern 120 may be spaced apart from the gate electrode GE across the lower capping pattern 110. For example, the lower capping pattern 110 may be between the upper capping pattern 120 and the gate electrode GE and between the upper capping pattern 120 and the gate dielectric pattern GI.

When viewed in cross-section, each of the lower capping pattern 110 and the upper capping pattern 120 may have a rectangular shape. The gate dielectric pattern GI may extend between each of the gate spacers GSP and the gate electrode GE, thereby being in contact with the lower capping pattern 110. For example, topmost surfaces of the gate dielectric pattern GI may be in contact with a bottom surface of the lower capping pattern 110. The upper capping pattern 120 may cover the topmost surface 110U of the lower capping pattern 110, and the top surface 130U of the interlayer dielectric layer 130 may be substantially coplanar with the top surface 120U of the upper capping pattern 120. The topmost surface 110U of the lower capping pattern 110 may be located at a lower height relative to the substrate 100 in the vertical direction than that of the top surface 130U of the interlayer dielectric layer 130. The upper capping pattern 120 may be in contact with the topmost surface 110U of the lower capping pattern 110.

The gate structure GS may include the first region R1 whose opposite sides are provided with the contacts 140 and the second region R2 whose opposite sides are provided without the contacts 140. At the first region R1 of the gate structure GS, the upper capping pattern 120 may be in contact with the contacts 140. At the second region R2 of the gate structure GS, the gate spacers GSP may extend onto corresponding side surfaces of the capping pattern CAP, and a topmost surface of each of the gate spacers GSP may be substantially coplanar with the top surface 130U of the interlayer dielectric layer 130. Each of the gate spacers GSP may be interposed between the capping pattern CAP and the interlayer dielectric layer 130, and in contact with the lower capping pattern 110 and the upper capping pattern 120.

Figure 15:
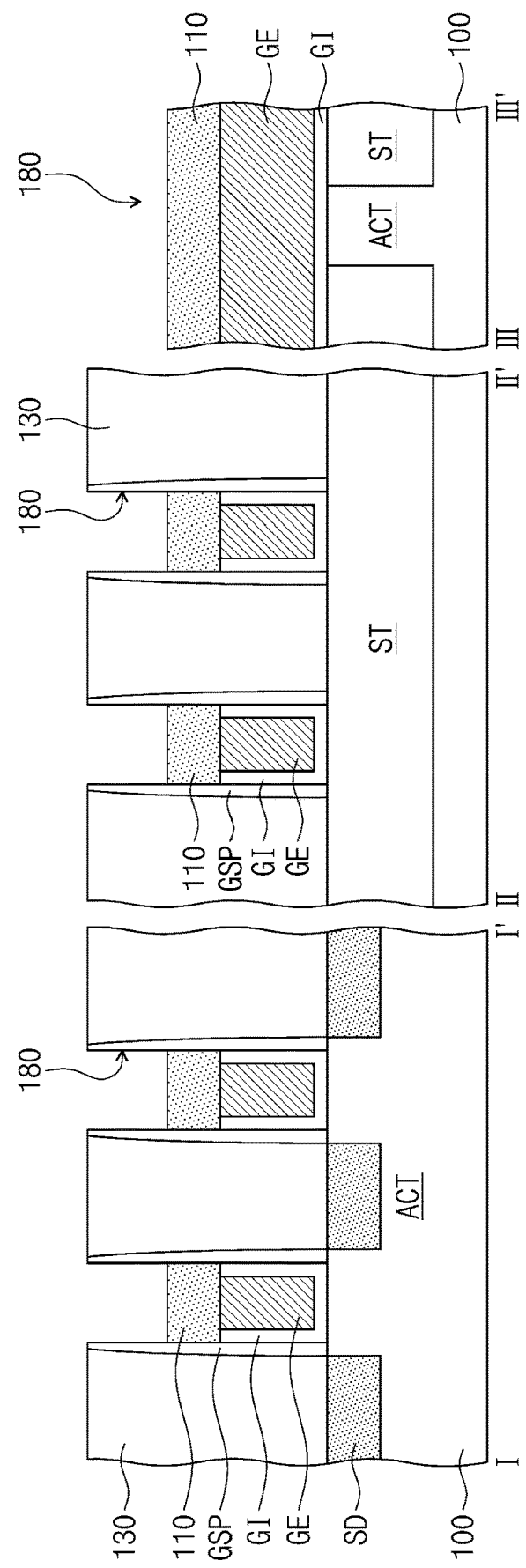
FIG. 15 illustrates a cross-sectional view taken along lines I-I', II-II', and III-III' of FIG. 1, showing a method of manufacturing a semiconductor device, according to exemplary embodiments.

FIG. 15 illustrates a cross-sectional view taken along lines I-I', II-II', and III-III' of FIG. 1, showing a method of manufacturing a semiconductor device, according to exemplary embodiments. For example, FIG. 15 illustrates an exemplary method of manufacturing the semiconductor device of FIG. 14. For brevity of explanation, the following description will focus on differences from the manufacturing method discussed with reference to FIGS. 4 to 10.

As discussed with reference to FIGS. 4 to 6, the substrate 100 may be provided thereon with the device isolation layer ST defining the active pattern ACT and the sacrificial gate pattern 160 running across the active pattern ACT. The etch stop pattern 150 may be formed below the sacrificial gate pattern 160, and the gate spacers GSP may be formed on corresponding side surfaces of the sacrificial gate pattern 160. The source/drain regions SD may be formed in the active pattern ACT on opposite sides of the sacrificial gate pattern 160, and the interlayer dielectric layer 130 may be formed to cover the sacrificial gate pattern 160 and the source/drain regions SD. The sacrificial gate pattern 160 and the etch stop pattern 150 may be removed to form the gap 180 between the gate spacers GSP. The gate electrode GE and the gate dielectric pattern GI may be formed to fill a lower portion of the gap 180.

Referring to FIG. 15, a lower capping layer (not shown) may be formed on the interlayer dielectric layer 130 to fill an upper portion of the gap 180. The lower capping layer may be formed to substantially completely fill the upper portion of the gap 180. The formation of the lower capping layer may include performing a first deposition process. The first deposition process may be performed under an atmosphere whose $H_2$ plasma density is relatively low. For example, the first deposition process may include indirect $H_2$ plasma treatment or not include $H_2$ plasma treatment. The lower capping layer may include, for example, silicon nitride. The lower capping layer may be etched until reaching a desired thickness or depth in the vertical direction in the gap 180 to form the lower capping pattern 110.

Subsequent processes may be substantially the same as the manufacturing method discussed with reference to FIGS. 2, 9, and 10.

Figure 16:
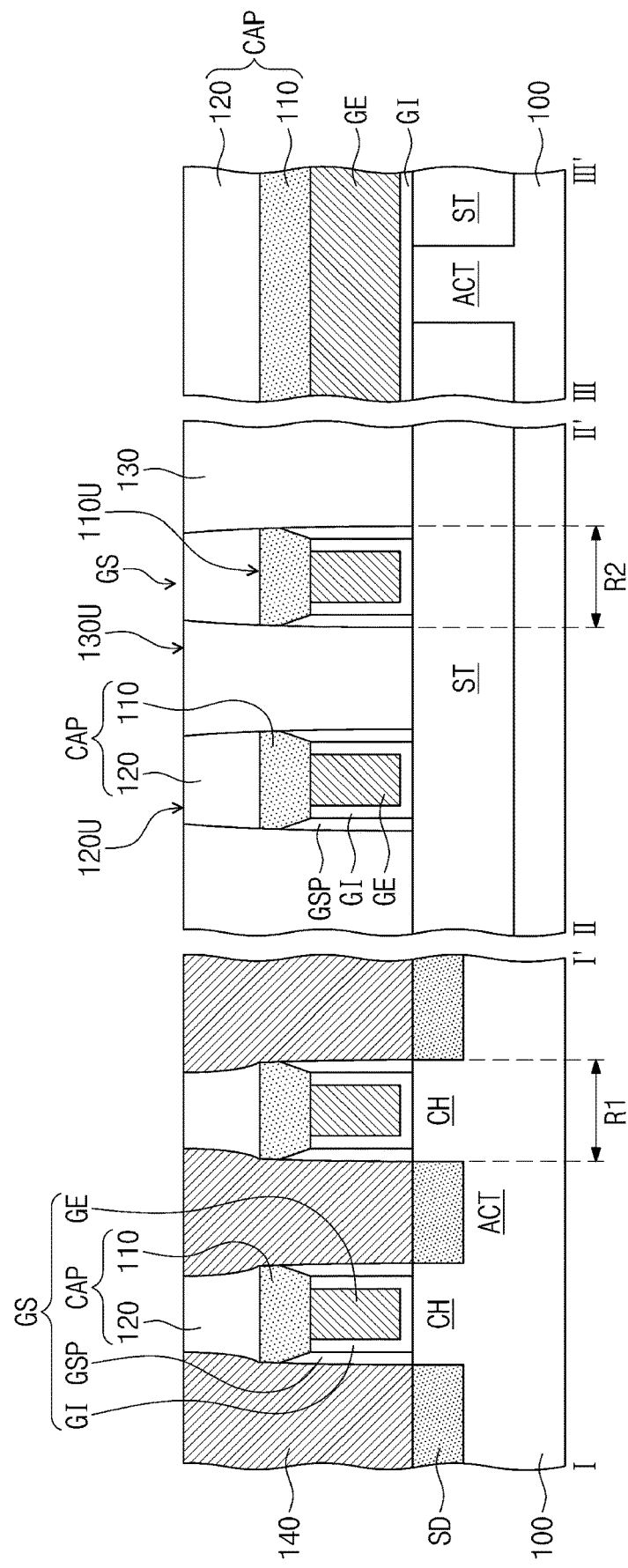
FIG. 16 illustrates a cross-sectional view taken along lines I-I', II-II', and III-III' of FIG. 1, showing a semiconductor device, according to exemplary embodiments.

FIG. 16 illustrates a cross-sectional view taken along lines I-I', II-II', and III-III' of FIG. 1, showing a semiconductor device according to exemplary embodiments. For brevity of explanation, the following description will focus on differences from the semiconductor device discussed with reference to FIGS. 1 to 3.

Referring to FIGS. 1 and 16, the capping pattern CAP may include the upper capping pattern 120 on the gate electrode GE and the lower capping pattern 110 between the gate electrode GE and the upper capping pattern 120. Each of the lower capping pattern 110 and the upper capping pattern 120 may extend in the second direction D2 along the top surface of the gate electrode GE, when viewed in plan. The upper capping pattern 120 may be spaced apart from the gate electrode GE across the lower capping pattern 110. In addition, the upper capping pattern 120 may be spaced apart from each of the gate spacers GSP across the lower capping pattern 110. For example, the lower capping pattern 110 may be between the upper capping pattern 120 and the gate electrode GE and between the upper capping pattern 120 and the gate spacers GSP.

The gate dielectric pattern GI may extend between each of the gate spacers GSP and the gate electrode GE, thereby being in contact with the lower capping pattern 110. Each of the gate spacers GSP may have a topmost surface in contact with the lower capping pattern 110. The upper capping pattern 120 may cover the topmost surface 110U of the lower capping pattern 110, and the top surface 130U of the interlayer dielectric layer 130 may be substantially coplanar with the top surface 120U of the upper capping pattern 120. The topmost surface 110U of the lower capping pattern 110 may be located at a lower height relative to the substrate 100 in the vertical direction than that of the top surface 130U of the interlayer dielectric layer 130. The upper capping pattern 120 may be in contact with the topmost surface 110U of the lower capping pattern 110. In some embodiments, the topmost surface of the gate spacers GSP may be a slanted surface that extends from one side surface of the gate spacer GSP to another side surface of the gate spacer GSP and faces the lower capping pattern 110.

The gate structure GS may include the first region R1 whose opposite sides are provided with the contacts 140 and the second region R2 whose opposite sides are provided without the contacts 140. At the first region R1 of the gate structure GS, the upper capping pattern 120 may be in contact with the contacts 140. At the second region R2 of the gate structure GS, the lower capping pattern 110 and the upper capping pattern 120 may be in contact with the interlayer dielectric layer 130.

Figure 17:
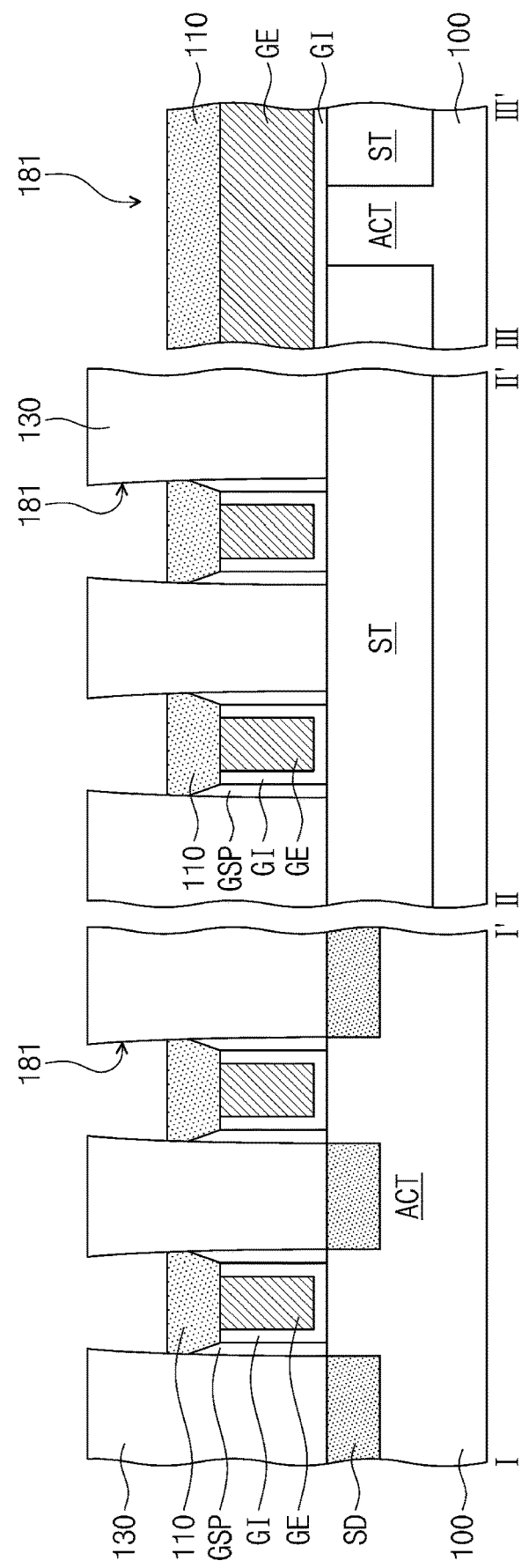
FIG. 17 illustrates a cross-sectional view taken along lines I-I', II-II', and III-III' of FIG. 1, showing a method of manufacturing a semiconductor device, according to exemplary embodiments.

FIG. 17 illustrates a cross-sectional view taken along lines I-I', II-II', and III-III' of FIG. 1, showing a method of manufacturing a semiconductor device according to exemplary embodiments. For example, FIG. 17 illustrates an exemplary method of manufacturing the semiconductor device of FIG. 16. For brevity of explanation, the following description will focus on differences from the manufacturing method discussed with reference to FIGS. 4 to 10.

As discussed with reference to FIGS. 4 to 6, the substrate 100 may be provided thereon with the device isolation layer ST defining the active pattern ACT and the sacrificial gate pattern 160 running across the active pattern ACT. The etch stop pattern 150 may be formed below the sacrificial gate pattern 160, and the gate spacers GSP may be formed on corresponding side surfaces of the sacrificial gate pattern 160. The source/drain regions SD may be formed in the active pattern ACT on opposite sides of the sacrificial gate pattern 160, and the interlayer dielectric layer 130 may be formed to cover the sacrificial gate pattern 160 and the source/drain regions SD. The sacrificial gate pattern 160 and the etch stop pattern 150 may be removed to form the gap 180 between the gate spacers GSP. The gate electrode GE and the gate dielectric pattern GI may be formed to fill a lower portion of the gap 180.

Referring to FIG. 17, upper portions of the gate spacers GSP may be removed, and thus the interlayer dielectric layer 130 may be provided therein with a recess region 181 exposing an inner surface of the interlayer dielectric layer 130. The recess region 181 may be defined by the inner surface of the interlayer dielectric layer 130, a top surface of the gate electrode GE, a topmost surface of the gate dielectric pattern GI, and topmost surfaces of the gate spacers GSP. The removal of the upper portions of the gate spacers GSP may include performing an etching process having an etch selectivity to the interlayer dielectric layer 130, the gate electrode GE, and the gate dielectric pattern GI.

A lower capping layer (not shown) may be formed on the interlayer dielectric layer 130 to fill the recess region 181. The lower capping layer may be formed to substantially completely fill the recess region 181. The formation of the lower capping layer may include performing a first deposition process. The first deposition process may be performed under an atmosphere whose $H_2$ plasma density is relatively low. For example, the first deposition process may include indirect $H_2$ plasma treatment or not include $H_2$ plasma treatment. The lower capping layer may include, for example, silicon nitride. The lower capping layer may be etched until reaching a desired thickness or depth in the vertical direction in the recess region 181 to form the lower capping pattern 110.

Subsequent processes may be substantially the same as the manufacturing method discussed with reference to FIGS. 2, 9, and 10.

Figure 18:
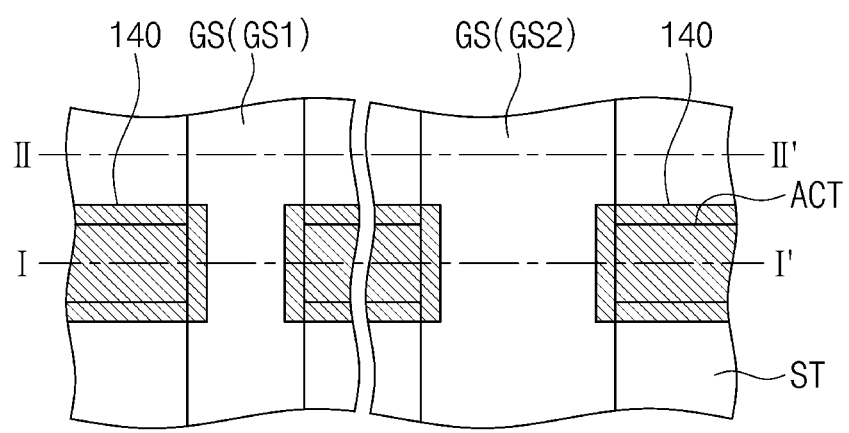
FIG. 18 illustrates a plan view showing a semiconductor device, according to exemplary embodiments.
Figure 18:
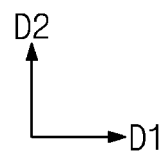
Figure 19:
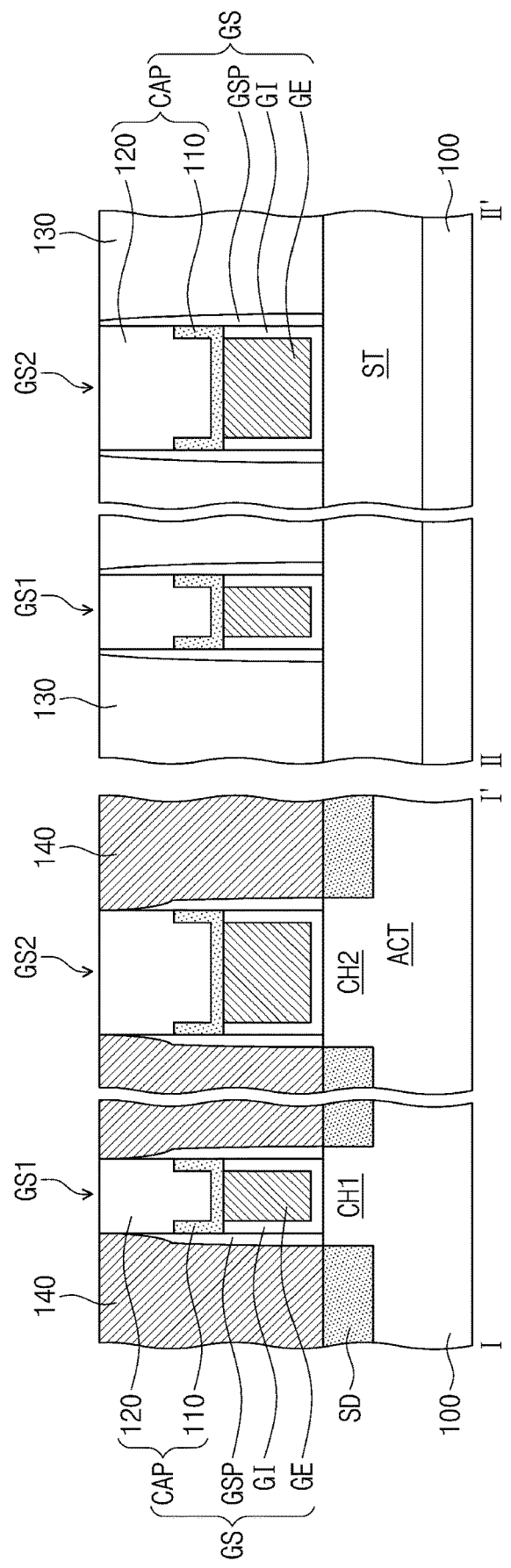
FIG. 19 illustrates a cross-sectional view taken along lines I-I' and II-II' of FIG. 18.

FIG. 18 illustrates a plan view showing a semiconductor device according to exemplary embodiments. FIG. 19 illustrates a cross-sectional view taken along lines I-I' and II-II' of FIG. 18. For brevity of explanation, the following description will focus on differences from the semiconductor device discussed with reference to FIGS. 1 to 3.

Referring to FIGS. 18 and 19, the gate structure GS may include a first gate structure GS1 overlapping a first channel region CH1 and a second gate structure GS2 overlapping a second channel region CH2. The first channel region CH1 may have a channel length (e.g., a length in the direction D1) less than a channel length (e.g., a length in the direction D1) of the second channel region CH2. In some embodiments, each of the first gate structure GS1 and the second gate structure GS2 may include the gate electrode GE, the gate dielectric pattern GI, the gate spacers GSP, and the capping pattern CAP. The capping pattern CAP may include the upper capping pattern 120 and the lower capping pattern 110. The first gate structure GS1 and the second gate structure GS2 may be configured substantially the same as each other, except for different gate lengths from each other. For example, in the embodiment of FIGS. 18 and 19, the width in the direction D1 of the first gate structure GS1 may be smaller than the width in the direction D1 of the second gate structure GS2.

Figure 20:
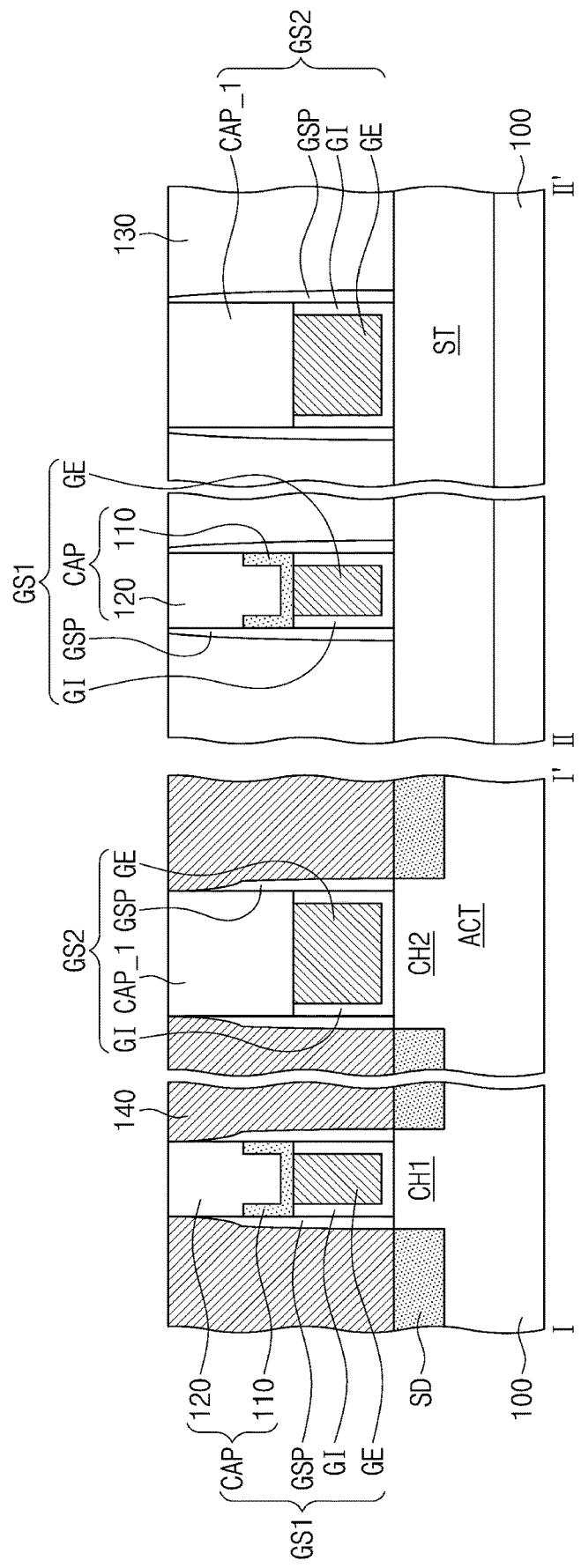
FIG. 20 illustrates a cross-sectional view taken along lines I-I' and II-II' of FIG. 18, showing a semiconductor device, according to exemplary embodiments.

FIG. 20 illustrates a cross-sectional view taken along lines I-I' and II-II' of FIG. 18, showing a semiconductor device according to exemplary embodiments. For brevity of explanation, the following description will focus on differences from the semiconductor device discussed with reference to FIGS. 1 to 3.

Referring to FIGS. 18 and 20, the gate structure GS may include a first gate structure GS1 overlapping a first channel region CH1 and a second gate structure GS2 overlapping a second channel region CH2. The first channel region CH1 may have a channel length (e.g., a length in the direction D1) less than a channel length (e.g., a length in the direction D1) of the second channel region CH2. In some embodiments, each of the first gate structure GS1 and the second gate structure GS2 may include the gate electrode GE, the gate dielectric pattern GI, and the gate spacers GSP. The first gate structure GS1 may include the capping pattern CAP. The capping pattern CAP may include the upper capping pattern 120 and the lower capping pattern 110. In contrast, the second gate structure GS2 may include a single-layered capping pattern CAP_1. The single-layered capping pattern CAP_1 may include the same material as that of the upper capping pattern 120, and may be formed by performing a deposition process the same as that for forming the upper capping pattern 120. The lower capping pattern 110 may be selectively provided only to the first gate structure GS1. The single-layered capping pattern CAP_1 may be in contact with the gate electrode GE and the gate dielectric pattern GI that are included in the second gate structure GS2. Each of the gate spacers GSP included in the second gate structure GS2 may be interposed between the single-layered capping pattern CAP_1 and the interlayer dielectric layer 130.

According to certain exemplary embodiments, the capping pattern CAP may be formed as a multi-layered structure including the upper capping pattern 120 and the lower capping pattern 110. The lower capping pattern 110 may be formed by the first deposition process performed under an atmosphere whose $H_2$ plasma density is relatively low. In this case, hydrogen may minimize or decrease in diffusion into the gate electrode GE during the first deposition process, and thereafter the lower capping pattern 110 may suppress or prevent hydrogen from diffusing into the gate electrode GE during the second deposition process for forming the upper capping pattern 120. Accordingly, it may be easy to control a threshold voltage of the gate electrode GE.

In addition, when the etching process is performed to form the contact holes 140H, the upper capping pattern 120 may exhibit etching resistance greater than that of the lower capping pattern 110. The upper capping pattern 120 may be formed to cover the topmost surface 110U of the lower capping pattern 110, and therefore, the capping pattern CAP may be minimized or prevented from loss during the etching process for forming the contact holes 140H. Accordingly, a process margin may be kept during the etching process for forming the contact holes 140H Consequently, not only a process margin may be securely obtained in manufacturing a semiconductor device, but the semiconductor device may have improvement in electrical characteristics.

The aforementioned description provides exemplary embodiments for explaining inventive concepts. Therefore, inventive concepts are not limited to the embodiments described above, and it will be understood by one of ordinary skill in the art that variations in form and detail may be made therein without departing from the spirit and essential features of inventive concepts.

What is claimed is:

1. A semiconductor device comprising:
a gate electrode on a substrate;
a capping pattern on the gate electrode; and
gate spacers on corresponding side surfaces of the gate electrode, the gate spacers spaced apart from each other with the gate electrode therebetween,
wherein the capping pattern comprises:
an upper capping pattern on the gate electrode; and
a lower capping pattern between the gate electrode and the upper capping pattern,
wherein the lower capping pattern comprises:
a first portion between the gate electrode and the upper capping pattern; and
a plurality of second portions extending from the first portion onto corresponding side surfaces of the upper capping pattern,
wherein a width of the lower capping pattern increases as a distance from an upper surface of the gate electrode increases,
wherein a side surface of each of the plurality of second portions is inclined with respect to an upper surface of the substrate, and
wherein each of the gate spacers extends onto the inclined side surface of a corresponding one of the plurality of second portions and is in contact with the inclined side surface of the corresponding one of the plurality of second portions, and an upper end of each of the gate spacers has a tapered shape.

2. The device of claim 1, further comprising:
a gate dielectric pattern between the substrate and the gate electrode,
wherein the gate dielectric pattern extends between each of the gate spacers and the gate electrode and is in contact with the lower capping pattern.

3. The device of claim 2,
wherein the gate dielectric pattern is in contact with a bottom surface of the lower capping pattern.

4. The device of claim 3, wherein the upper capping pattern is spaced apart from the gate spacers and the gate dielectric pattern across the lower capping pattern.

5. The device of claim 3, wherein the gate dielectric pattern is in contact with a bottom surface of the first portion.

6. The device of claim 3, wherein the upper capping pattern covers a topmost surface of each of the second portions, and at least a portion of the upper capping pattern fills a space between the second portions of the lower capping pattern.

7. The device of claim 3, wherein the upper capping pattern comprises:
a body; and
a protrusion extending from the body toward the substrate,
wherein the protrusion is interposed between the second portions of the lower capping pattern, and the body covers a topmost surface of each of the second portions.

8. The device of claim 7, wherein a width of the protrusion increases as a distance from the upper surface of the gate electrode increases.

9. A semiconductor device comprising:
a gate electrode on a substrate;
a lower capping pattern on the gate electrode; and
gate spacers on corresponding side surfaces of the gate electrode, the gate spacers spaced apart from each other with the gate electrode therebetween,
wherein the lower capping pattern comprises:
a first portion in contact with an upper surface of the gate electrode; and
a plurality of second portions extending from the first portion,
wherein an upper surface of the first portion is located at a height lower than a height of uppermost surfaces of the plurality of second portions relative to an upper surface of the substrate,
wherein a width of the lower capping pattern increases as a distance from an upper surface of the gate electrode increases,
wherein a side surface of each of the plurality of second portions is inclined with respect to an upper surface of the substrate, and
wherein each of the gate spacers extends onto the inclined side surface of a corresponding one of the plurality of second portions of the lower capping pattern.

10. The device of claim 9, wherein an upper end of each of the gate spacers has a tapered shape.

11. The device of claim 9, further comprising:
a gate dielectric pattern between the substrate and the gate electrode,
wherein the gate dielectric pattern extends between each of the gate spacers and the gate electrode and is in contact with the lower capping pattern.

12. The device of claim 9, further comprising:
an upper capping pattern on the lower capping pattern,
wherein the upper capping pattern covers a topmost surface of the lower capping pattern.

13. The device of claim 12, wherein the upper capping pattern is spaced apart from the gate spacers across the lower capping pattern.

14. The device of claim 12, further comprising:
an interlayer dielectric layer on the substrate,
wherein the interlayer dielectric layer is in contact with side surfaces of the upper capping pattern and side surfaces of the gate spacers.

15. The device of claim 14, wherein topmost surfaces of the gate spacers are located at a lower height relative to the substrate than that of a top surface of the upper capping pattern.

16. A semiconductor device comprising:
a gate electrode on a substrate;
a capping pattern on the gate electrode;
gate spacers on corresponding side surfaces of the gate electrode; and
a gate dielectric pattern between each of the gate spacers and the gate electrode and between the substrate and the gate electrode,
wherein the capping pattern comprises:
an upper capping pattern on the gate electrode; and
a lower capping pattern between the gate electrode and the upper capping pattern,
wherein the lower capping pattern comprises:
a first portion between the gate electrode and the upper capping pattern; and
a plurality of second portions extending from the first portion onto corresponding side surfaces of the upper capping pattern,
wherein uppermost surfaces of the plurality of second portions are at a level higher than a level of a lower surface of the upper capping pattern relative to an upper surface of the substrate,
wherein a width of the lower capping pattern increases as a distance from the upper surface of the gate electrode increases,
wherein each of the gate spacers has an upper surface inclined with respect to the top surface of the substrate and in contact with a side surface of a corresponding one of the plurality of second portions.

17. The device of claim 16,
wherein the upper capping pattern is spaced apart from the gate spacers and the gate dielectric pattern across the lower capping pattern.

18. The device of claim 16,
wherein the upper capping pattern covers a topmost surface of each of the second portions, and
wherein at least a portion of the upper capping pattern fills a space between the second portions of the lower capping pattern.

19. The device of claim 16, wherein the upper capping pattern comprises:
a body; and
a protrusion extending from the body toward the substrate,
wherein the protrusion is interposed between the second portions of the lower capping pattern, and
wherein the body covers a topmost surface of each of the second portions, and wherein a width of the protrusion increases as a distance from the upper surface of the gate electrode increases.

* * * * *